United States Patent
Zhu

(10) Patent No.: US 9,595,594 B2
(45) Date of Patent: Mar. 14, 2017

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventor: Lei Zhu, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 88 days.

(21) Appl. No.: 13/868,429

(22) Filed: Apr. 23, 2013

(65) Prior Publication Data

US 2013/0337619 A1 Dec. 19, 2013

(30) Foreign Application Priority Data

Jun. 18, 2012 (JP) .................. 2012-137281

(51) Int. Cl.
*H01L 29/66* (2006.01)
*H01L 29/778* (2006.01)
(Continued)

(52) U.S. Cl.
CPC .... *H01L 29/66431* (2013.01); *H01L 29/1075* (2013.01); *H01L 29/1079* (2013.01); *H01L 29/2003* (2013.01); *H01L 29/4232* (2013.01); *H01L 29/66462* (2013.01); *H01L 29/778* (2013.01); *H01L 29/7787* (2013.01); *H01L 29/7789* (2013.01); *H02M 3/335* (2013.01);
(Continued)

(58) Field of Classification Search
CPC ............. H01L 29/7787; H01L 29/0891; H01L 29/66431; H01L 29/66462; H01L 29/4232; H01L 41/29; H01L 29/7789; H01L 29/1075; H01L 29/2003; H01L 29/1079; H01L 29/778; H03F 3/1935; H03F 3/24; H03F 1/3241; H03F 3/195; H02M 3/335; H02M 3/33507
See application file for complete search history.

(56) References Cited

U.S. PATENT DOCUMENTS 7,589,360 B2 * 9/2009 Matocha ............... H01L 29/045
                                                        257/192
8,134,180 B2 * 3/2012 Otake .................. H01L 29/045
                                                        257/192

(Continued)

FOREIGN PATENT DOCUMENTS

JP      2008-4720 A1    1/2008
JP    2009-170746 A1    7/2009

(Continued)

OTHER PUBLICATIONS

English translation of JP2009-170746.*

(Continued)

*Primary Examiner* — Latanya N Crawford
(74) *Attorney, Agent, or Firm* — Kratz, Quintos & Hanson, LLP

(57) ABSTRACT

A compound semiconductor device includes: a compound semiconductor region having a surface in which a step is formed; a first electrode formed so as to overlie the upper surface of the step, the upper surface being a non-polar face; and a second electrode formed along a side surface of the step so as to be spaced apart from the first electrode in a vertical direction, the side surface being a polar face.

6 Claims, 18 Drawing Sheets

(51) Int. Cl.
    *H02M 3/335* (2006.01)
    *H03F 3/193* (2006.01)
    *H03F 1/32* (2006.01)
    *H03F 3/195* (2006.01)
    *H03F 3/24* (2006.01)
    *H01L 29/423* (2006.01)
    *H01L 29/10* (2006.01)
    *H01L 29/20* (2006.01)

(52) U.S. Cl.
    CPC ...... *H02M 3/33507* (2013.01); *H03F 1/3241* (2013.01); *H03F 3/195* (2013.01); *H03F 3/1935* (2013.01); *H03F 3/24* (2013.01)

(56) References Cited

U.S. PATENT DOCUMENTS

| | | | | |
|---|---|---|---|---|
| 8,878,345 | B2* | 11/2014 | Yao | C30B 25/18 257/613 |
| 2006/0270087 | A1* | 11/2006 | Imer | C30B 25/02 438/46 |
| 2008/0121927 | A1* | 5/2008 | Matocha et al. | 257/183 |
| 2008/0315210 | A1* | 12/2008 | Ohta | H01L 29/045 257/76 |
| 2009/0057684 | A1* | 3/2009 | Otake et al. | 257/76 |
| 2009/0065900 | A1* | 3/2009 | Saito et al. | 257/615 |
| 2010/0207164 | A1* | 8/2010 | Shibata | H01L 29/41766 257/192 |
| 2013/0062739 | A1* | 3/2013 | Yao | C30B 25/18 257/627 |
| 2013/0113018 | A1 | 5/2013 | Wakita et al. | |

FOREIGN PATENT DOCUMENTS

| | | | | |
|---|---|---|---|---|
| JP | WO 2011099469 A1 * | 8/2011 | | C30B 25/18 |
| JP | 2011-233612 A | 11/2011 | | |
| JP | 2012-033679 A | 2/2012 | | |
| WO | WO 2010/016212 A1 | 2/2010 | | |

OTHER PUBLICATIONS

Office Action of Taiwanese Patent Application No. 102114582 dated Jan. 26, 2015 with English Summary of TWOA.

Office Action of corresponding Japanese Patent Application No. 2012-137281 dated Jan. 5, 2016, with partial translation.

* cited by examiner

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2012-137281, filed on Jun. 18, 2012, the entire contents of which are incorporated herein by reference.

FIELD

The embodiments discussed herein are related to a compound semiconductor device and a method for manufacturing the compound semiconductor device.

BACKGROUND

Since nitride semiconductors have characteristics such as exhibiting high saturated electron velocity and a wide band gap, application of nitride semiconductors to semiconductor devices having high withstand voltage and high power has been studied on the basis of utilization of such characteristics. For example, the band gap of GaN that is a nitride semiconductor is 3.4 eV and larger than the band gap of Si (1.1 eV) and the band gap of GaAs (1.4 eV); thus, GaN exhibits high breakdown field strength. GaN is therefore a highly practical material used for power semiconductor devices which operate at high voltage and which output high power.

Semiconductor devices utilizing nitride semiconductors, such as field effect transistors, have been reported, in particular, high electron mobility transistors (HEMTs). Among HEMTs utilizing GaN (GaN-HEMTs), for instance, an AlGaN/GaN-HEMT in which GaN is used for an electron transit layer and in which AlGaN is used for an electron supply layer is attracting attention. The AlGaN/GaN-HEMT is expected to be applied to highly efficient switching devices and power devices used for electric vehicles.

Related art is disclosed in Japanese Laid-open Patent Publication Nos. 2009-170746 and 2008-4720.

In nitride semiconductor devices, a technique for controlling local generation of two dimensional electron gas (2DEG) is demanded. In view of so-called fail safe, for example, HEMTs desirably operate in a normally-off mode in which electric current does not flow in the case where gate voltage is not applied.

In existing HEMTs such as AlGaN/GaN-HEMTs, surfaces (upper surfaces) of GaN and AlGaN used for an electron transit layer and an electron supply layer, respectively, are c-planes (0001) or are m-planes (1-100) or a-planes (11-20).

In an AlGaN/GaN-HEMT having the former structure, the gate electrode, the source electrode, and the drain electrode are formed on the c-plane that is a polar face. A difference in a lattice constant between GaN and AlGaN generates distortion in AlGaN, which causes piezoelectric polarization and spontaneous polarization of AlGaN. Since a channel in a transistor is formed along such a polar face, high-concentration 2DEG is generated owing to the piezoelectric polarization and the spontaneous polarization. In this case, however, the high-concentration 2DEG in the channel causes the flow of gate current even though the gate voltage is not applied, and a negative voltage is therefore applied to a gate electrode to interrupt the gate current. This phenomenon is operation in a normally-on mode; thus, there is a problem in that it is difficult to enable desired operation in a normally-off mode.

In an AlGaN/GaN-HEMT having the latter structure, the gate electrode, the source electrode, and the drain electrode are formed on an m-plane or an a-plane that is each a non-polar face. Since a channel is formed along such a non-polar surface, piezoelectric polarization and spontaneous polarization are not caused. 2DEG is not generated in the channel in the case where the gate voltage is not applied, and gate current does not flow; hence, operation in a normally-off mode is enabled. In this case, however, the absence of 2DEG in the channel increases on-resistance, which becomes problematic.

Furthermore, there is a problem common to AlGaN/GaN-HEMTs having the former or latter structure. In order to provide high withstand voltage that is a requirement for power devices, the length $L_{gd}$ between the gate electrode and the drain electrode is increased.

An increase in the length $L_{gd}$ unfortunately leads to an increase in the size of a device, which restricts the number of devices that may be integrated. Although the demand for a power device, such as an AlGaN/GaN-HEMT, having a fine structure and enabling high integration has been increased in recent years, it has been difficult for existing AlGaN/GaN-HEMTs that have channels formed along a polar or non-polar face to satisfy such demands.

SUMMARY

According to an aspect of the invention, a compound semiconductor device includes: a compound semiconductor region having a surface in which a step is formed; a first electrode formed so as to overlie the upper surface of the step, the upper surface being a non-polar face; and a second electrode formed along a side surface of the step so as to be spaced apart from the first electrode in a vertical direction, the side surface being a polar face.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
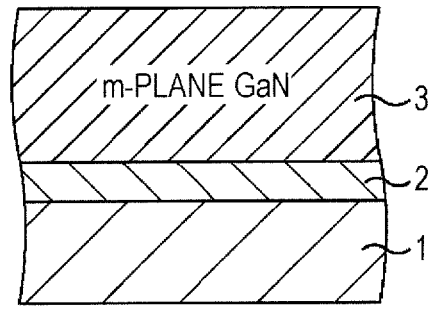
FIGS. 1A to 1C are schematic cross-sectional views each illustrating a process for manufacturing an AlGaN/GaN-HEMT according to a first embodiment in sequence.

Embodiments will now be described in detail with reference to the accompanying drawings. In each of the following embodiments, the configuration of a compound semiconductor device will be described with reference to a method for manufacturing the compound semiconductor device. In the drawings, some of the components that are illustrated have been changed in relative size and thickness for the convenience of illustration.

First Embodiment

The first embodiment discloses a compound semiconductor device that is a Schottky type AlGaN/GaN-HEMT. FIGS. 1A to 2C are schematic cross-sectional views each illustrating a method for manufacturing the AlGaN/GaN-HEMT of the first embodiment in the process sequence. Although not illustrated, an isolation structure is formed in an isolation region by injection of argon (Ar) or another material.

As illustrated in FIG. 1A, a buffer layer 2 and an electron transit layer 3 that are compound semiconductor layers are formed on a growth substrate such as an m-plane SIC substrate (hereinafter referred to as SIC substrate) 1 in sequence. In place of the SIC substrate, a sapphire substrate or a GaAs substrate may be used as a growth substrate. The substrate may be a semi-insulating substrate or a conductive substrate.

In particular, compound semiconductors described below are grown on the SiC substrate 1 by, for example, metal organic vapor phase epitaxy (MOVPE). In place of MOVPE, molecular beam epitaxy (MBE) or another technique may be used. AlN is grown on the SiC substrate 1 to a thickness of approximately 5 nm, and i-GaN (intrinsic GaN) or n-GaN (n-type GaN) is grown thereon to a thickness of approximately one to several tens of micrometers. In the first embodiment, the layer of i-GaN or n-GaN is formed above the SiC substrate 1 so as to have a surface (upper surface parallel to the upper surface of the SiC substrate 1) that is an m-plane being a non-polar face. Instead of an m-plane, such a layer may be formed so as to have an a-plane. In this manner, the buffer layer 2 and the electron transit layer 3 having an upper surface that is an m-plane are formed so as to overlie the SiC substrate 1. In the formation of the buffer layer 2, AlGaN may replace AlN, or GaN may be grown at low temperature. A GaN substrate may be employed as the growth substrate, and the electron transit layer 3 may be formed on the GaN substrate without forming the buffer layer 2.

In the growth of AlN and GaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined in view of a compound semiconductor layer to be grown. The flow rate of ammonia gas that is the common material is approximately 100 ccm to 10 LM. Furthermore, the growth pressure is approximately 50 to 300 Torr, and the growth temperature is approximately 1000 to 1200° C.

In order to grow n-type GaN, for instance, a gas containing an n-type dopant such as Si (for example, $SiH_4$ gas) is added to the mixed gas at a predetermined flow rate to dope GaN with Si. The concentration of Si as a dopant is, for instance, approximately $1 \times 10^{17}/cm^3$.

Figure 1B:
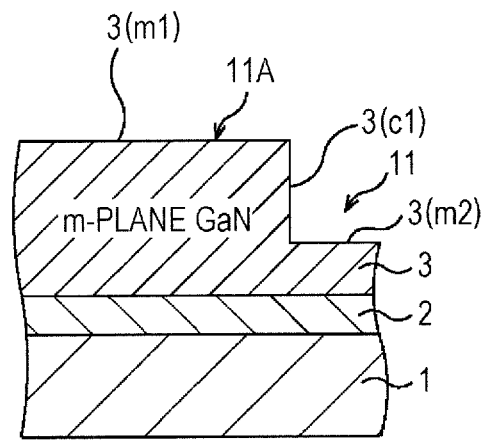

As illustrated in FIG. 1B, a protrusion 11A that serves as a step is then formed at the surface of the electron transit layer 3. In particular, a region of the electron transit layer 3 on which the drain electrode is to be formed is dry-etched to form a groove 11 having a depth of approximately one to several tens of micrometers (value determined by withstand voltage; for instance, depth will be several micrometers for a withstand voltage of several hundred volts and will be several tens of micrometers for a withstand voltage of several thousand volts). Examples of the etching gas used in such dry etching include $BCl_3$ and $Cl_2$. The formation of the groove 11 in the surface of the electron transit layer 3 generates the protrusion 11A at this surface, the protrusion 11A serving as the step.

Figure 3:
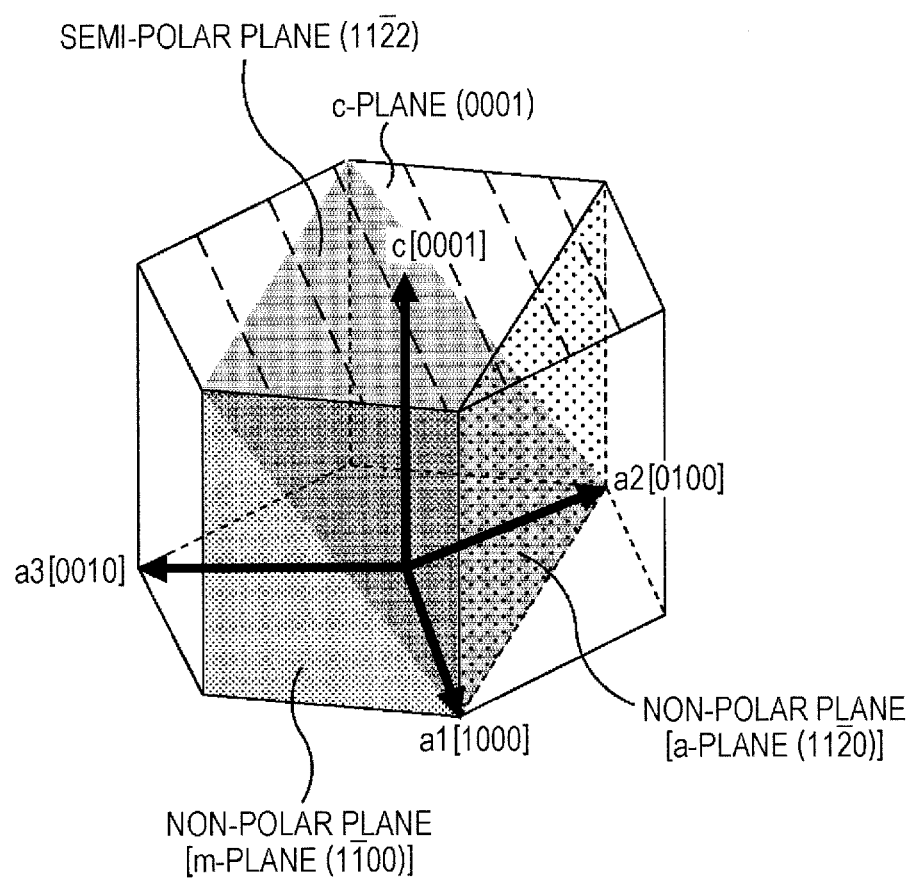
FIG. 3 schematically illustrates the plane orientation of GaN crystal.

FIG. 3 illustrates the plane orientation of a GaN crystal. In the GaN crystal, when the a1 axis [1000], the a2 axis [0100], and the a3 axis [0010] are defined, the upper surface of the GaN crystal is the c-plane (0001) that is a polar face. In this case, the m-plane (1-100) and a-plane (11-20) that are non-polar faces are orthogonal to the c-plane (0001). On the basis of the definition of the plane orientation in FIG. 3, among the surfaces of the electron transit layer 3, the upper surface of the protrusion 11A is an m-plane 3 (m1), the bottom of the groove 11 is an m-plane 3 (m2), and the side surface of the groove 11 (the side surface of the protrusion 11A) is a c-plane 3 (c1).

Figure 1C:
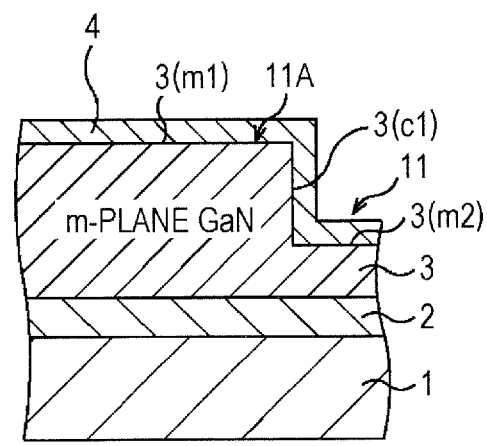

Then, as illustrated in FIG. 1C, an electron supply layer 4 is formed on the electron transit layer 3. In particular, i-AlGaN (intrinsic AlGaN) or n-AlGaN (n-type AlGaN) is grown on the electron transit layer 3 by MOVPE or another technique to a thickness of approximately 40 nm. In the first embodiment, a layer of i-AlGaN or n-AlGaN is formed on the electron transit layer 3 so as to have an upper surface (upper surface parallel to the upper surface of the SiC substrate 1) that is an m-plane. If the electron transit layer 3 is formed so as to have an upper surface that is an a-plane, the upper surface of the electron supply layer 4 is also an a-plane. In this manner, a compound semiconductor region including the buffer layer 2, the electron transit layer 3, and the electron supply layer 4 is formed.

In the growth of AlGaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of the composition of AlGaN ($Al_xGa_{1-x}N$: $0<x<1$). The flow rate of ammonia gas is approximately 100 ccm to 10 LM. Furthermore, for instance, the growth pressure is approximately 50 to 300 Torr, and the growth temperature is approximately 1000 to 1200° C.

In order to grow n-type AlGaN, for instance, a gas containing an n-type dopant such as Si (for example, $SiH_4$ gas) is added to the mixed gas at a predetermined flow rate to dope AlGaN with Si. The concentration of Si as a dopant is, for instance, approximately $1 \times 10^{13}/cm^3$.

Figure 2A:
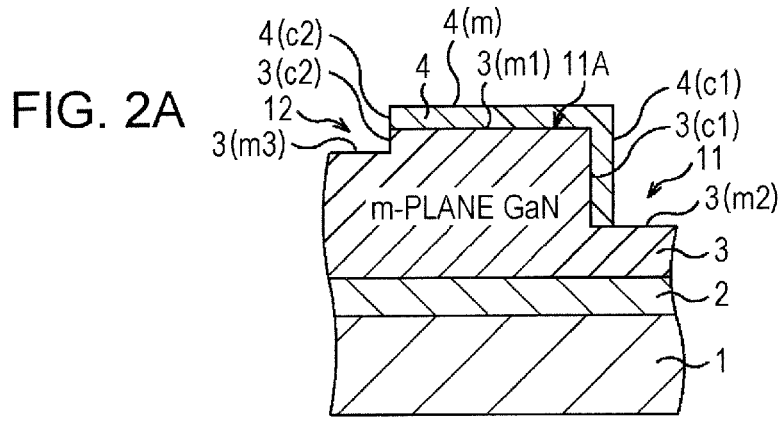
FIGS. 2A to 2C are schematic cross-sectional views each illustrating the subsequent process for manufacturing the AlGaN/GaN-HEMT according to the first embodiment in sequence.

Then, as illustrated in FIG. 2A, parts of the electron supply layer 4 are dry-etched, and part of the protrusion 11A is subsequently dry-etched. In particular, the electron supply layer 4 is dry-etched to expose the bottom of the groove 11 and a predetermined region of the protrusion 11A on which the source electrode is to be formed. In the dry etching, for example, $Cl_2$ or another material is employed as the etching gas (or simultaneous use of $Cl_2$ and $SF_6$). Then, the exposed region of the protrusion 11A on which the source electrode is to be formed is dry-etched to form a groove 12 having a depth of approximately 1 μm. Examples of the etching gas used in such dry etching include $BCl_3$ and $Cl_2$. On the basis of the definition of the plane orientation in FIG. 3, in the electron transit layer 3, the bottom of the groove 12 is an m-plane 3 ($m$3), and the side surface of the groove 12 (the side surface of the protrusion 11A) is a c-plane 3 ($c$2). In the electron supply layer 4, the upper surface is an m-plane 4 ($m$), one side surface is a c-plane 4 ($c$1), and the other side surface is a c-plane 4 ($c$2).

Figure 2B:
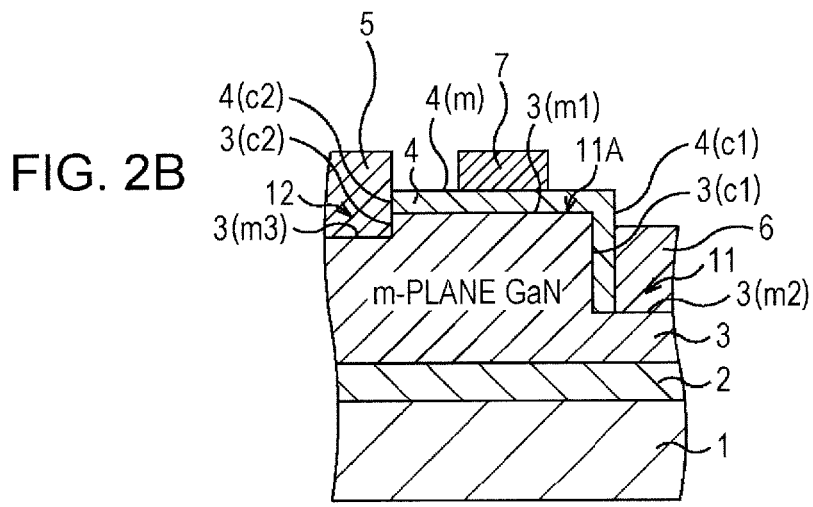

Then, as illustrated in FIG. 2B, a source electrode 5, a drain electrode 6, and a gate electrode 7 are formed. In particular, the source electrode 5 is formed in the groove 12, and the drain electrode 6 is formed in the groove 11. A resist mask used for forming the source electrode 5 and the drain electrode 6 is formed. A resist is applied onto an entire surface of the product, and then openings in which the grooves 11 and 12 are exposed are formed by a lithographic technique. In this manner, a resist mask having such openings is formed. An electrode material such as Ta/Al is deposited by, for example, a vapor deposition technique on the resist mask and in the openings in which the grooves 11 and 12 are exposed. Ta is deposited to a thickness of approximately 20 nm, and Al is deposited to a thickness of approximately 200 nm. The resist mask and Ta/Al deposited thereon are removed by a lift-off technique. Then, the SiC substrate 1 is heated under a nitrogen atmosphere at approximately 400 to 1000° C., for example approximately 600° C., and the remaining Ta/Al is brought into ohmic contact with the electron transit layer 3 and the electron supply layer 4. The heating need not be carried out in some cases provided that Ta/Al is brought into ohmic contact with the electron transit layer 3 and the electron supply layer 4. In this manner, the drain electrode 6 and the source electrode 5 are formed by filling the grooves 11 and 12 with part of the electrode material, respectively.

The bottom of the source electrode 5 is in ohmic contact with the m-plane 3 ($m$3) of the electron transit layer 3, and the side surface of the source electrode 5 is in ohmic contact with the c-plane 3 ($c$2) of the electron transit layer 3 and the c-plane 4 ($c$2) of the electron supply layer 4. The bottom of the drain electrode 6 is in ohmic contact with the m-plane 3 ($m$2) of the electron transit layer 3, and the side surface of the drain electrode 6 is in ohmic contact with the c-plane 4 ($c$1) of the electron supply layer 4.

Then, a gate electrode 7 is formed on the m-plane 4 ($m$) of the electron supply layer 4. A resist mask used for forming the gate electrode 7 is formed. A resist is applied onto an entire surface of the product, and then an opening used for exposing a region of the m-plane 4 ($m$) of the electron supply layer 4 on which the gate electrode 7 is to be formed is formed by a lithographic technique. In this manner, a resist mask having such an opening is formed.

An electrode material such as Ni/Au is deposited on the resist mask and in the opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 7 is formed on the m-plane 4 ($m$) of the electron supply layer 4 while Schottky contact is established therebetween.

Figure 2C:
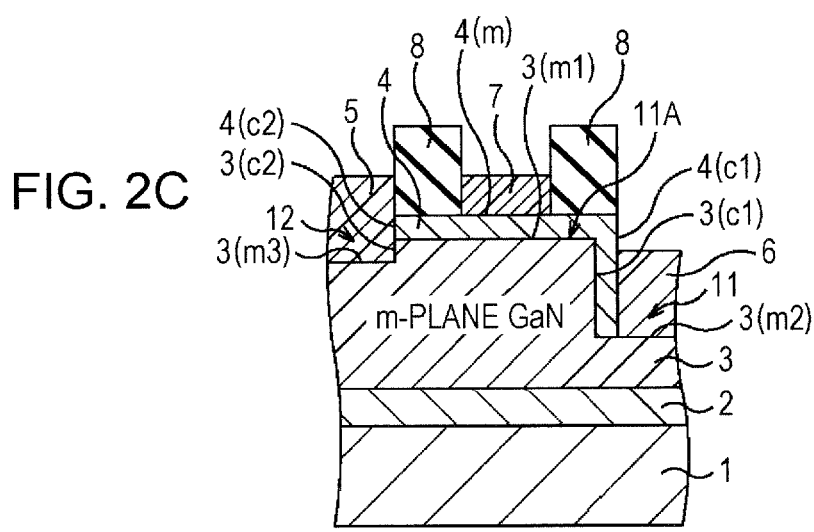

Then, as illustrated in FIG. 2C, an insulating film 8 is formed. In particular, an insulating material such as silicon oxide is deposited on an entire surface of the product by, for instance, a chemical vapor deposition (CVD) method. The deposited silicon oxide is processed by a lithographic technique and dry etching. In this manner, the insulating film 8 is formed so as to have openings above the source electrode 5, the drain electrode 6, and the gate electrode 7 to expose these electrodes.

Then, manufacturing of the AlGaN/GaN-HEMT of the first embodiment is completed through processes, for example, for providing wiring connected to the source electrode 5, the drain electrode 6, and the gate electrode 7.

Figure 4A:
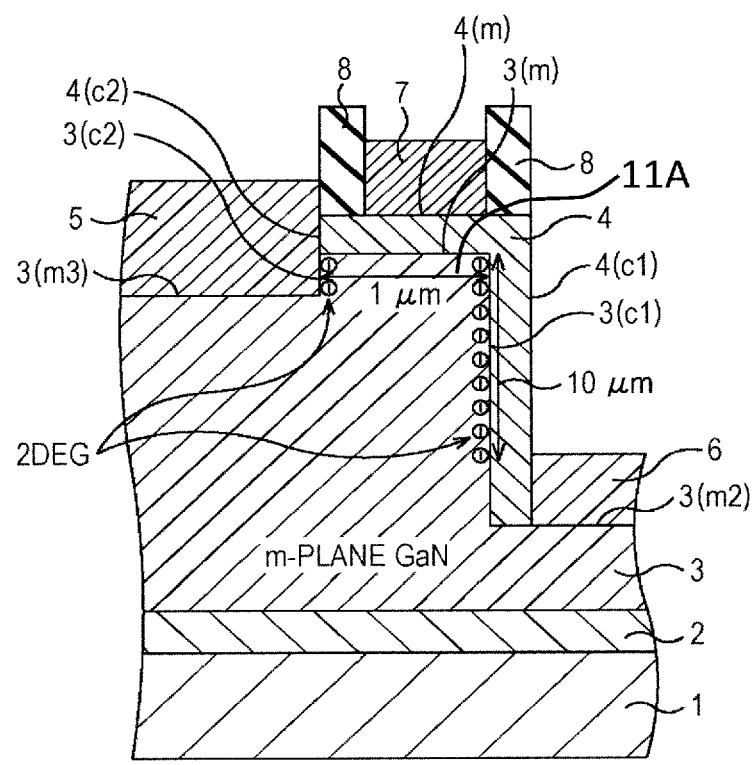
FIGS. 4A and 4B each schematically illustrate the AlGaN/GaN-HEMT according to the first embodiment.
Figure 4B:
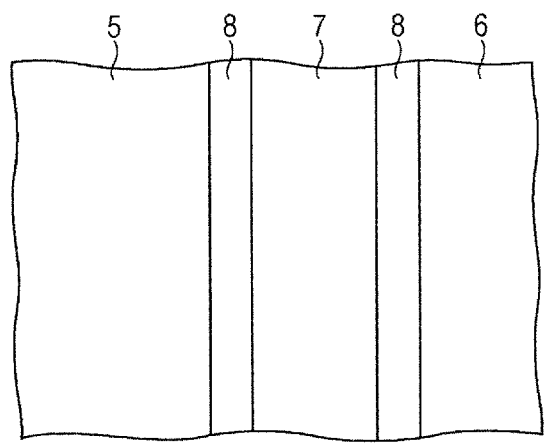

FIGS. 4A and 4B are a schematic cross-sectional view and a schematic plan view illustrating the AlGaN/GaN-HEMT of the first embodiment, respectively. The AlGaN/GaN-HEMT has a lateral structure between the gate electrode 7 and the source electrode 5 and a longitudinal structure between the gate electrode 7 and the drain electrode 6. The gate electrode 7 and the source electrode 5 are spaced apart from each other in a lateral direction (horizontal direction) along the upper surface of the protrusion 11A, and the gate electrode 7 and the drain electrode 6 are spaced apart from each other in a longitudinal direction (vertical direction) along the side surface of the protrusion 11A.

In the AlGaN/GaN-HEMT of the first embodiment, a channel is formed in the electron transit layer 3 along the interface to the electron supply layer 4 and between the source electrode 5 and the drain electrode 6. The gate electrode 7 is formed on the m-plane 4 ($m$) of the electron supply layer 4. Since part of the channel between the gate electrode 7 and the source electrode 5, which includes the region below the gate electrode 7, is formed along the m-plane of the protrusion 11A being a non-polar face, 2DEG is not generated in this part in a state in which gate voltage is not applied. In contrast, since part of the channel between the gate electrode 7 and the drain electrode 6 is formed along the c-plane of the protrusion 11A being a polar face, high-concentration 2DEG is generated in this part even in a state in which gate voltage is not applied. Operation in a normally-off mode is therefore steadily enabled.

In the AlGaN/GaN-HEMT of the first embodiment, part of the channel between the gate electrode 7 and the drain electrode 6 is formed along the c-plane of the protrusion 11A. On-resistance is therefore greatly reduced as compared with a case in which part of a channel between a gate electrode and a drain electrode is formed along an m-plane.

In the AlGaN/GaN-HEMT of the first embodiment, the source electrode 5 is formed so as to be embedded in the groove 12 of the protrusion 11A and contacts the c-plane 3 (c2) of the electron transit layer 3. In the electron transit layer 3, 2DEG is also generated on the c-plane 3 (c2) at the interface to the electron supply layer 4. The source electrode 5 contacts this 2DEG, so that stable ohmic contact is established.

In the AlGaN/GaN-HEMT of the first embodiment, part of the channel between the gate electrode 7 and the drain electrode 6 is formed in the longitudinal structure, in other words, along the side surface of the protrusion 11A. Even if the length $L_{gd}$ between the gate electrode 7 and the drain electrode 6 in a vertical direction is increased to exhibit high withstand voltage, the length between the gate electrode 7 and the drain electrode 6 in a horizontal direction is equivalent to the thickness of the electron supply layer 4 at most and is therefore negligible. Thus, when the device is seen in plane view, the area occupied by the device is substantially greatly reduced, which enables integration of a large number of devices.

The specific integration density of devices is described. Assuming that part of the channel between the gate electrode 7 and the source electrode 5 is 1 in length, the length of the channel is substantially equivalent to 1 μm in plane view. Assuming that the length $L_{gd}$ between the gate electrode 7 and the drain electrode 6 in the vertical direction is 10 μm, the withstand voltage is approximately 1000 V. In order to exhibit a withstand voltage of approximately 1000 V in existing AlGaN/GaN-HEMTs each having a lateral structure, a channel has a length of 11 μm (1-μm length between a gate electrode and a source electrode+10-μm length between the gate electrode and a drain electrode). The AlGaN/GaN-HEMT of the first embodiment accordingly enables the area occupied by a device to be reduced to an approximately eleventh part of the area to be occupied by such an existing AlGaN/GaN-HEMT having a lateral structure and enables the integration density of devices to be increased approximately 11 times the integration density of the existing AlGaN/GaN-HEMTs. In the case where a withstand voltage of approximately tens of thousands volts is exhibited, the first embodiment similarly enables the area occupied by a device to be reduced to an approximately several hundredth part of the area occupied by an existing device and enables the integration density of devices to be increased approximately several hundred times the integration density of existing devices.

On-resistance in the AlGaN/GaN-HEMT of the first embodiment is calculated by simulation. In this calculation, a one-dimensional Poisson's equation is employed. Since the effective mass of electrons and holes on an m-plane has not been determined yet, the calculation is carried out on the basis of the assumption that the effective mass of electrons and holes on an m-plane of GaN is equal to that on the c-plane.

Figure 5A:
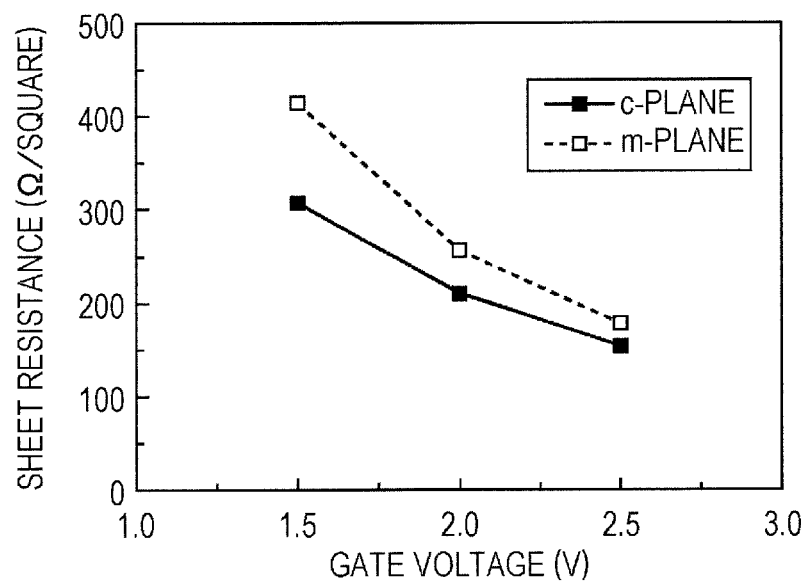
FIGS. 5A and 5B are graphs each schematically illustrating results of simulation calculation of on-resistance in the AlGaN/GaN-HEMT according to the first embodiment.
Figure 5B:
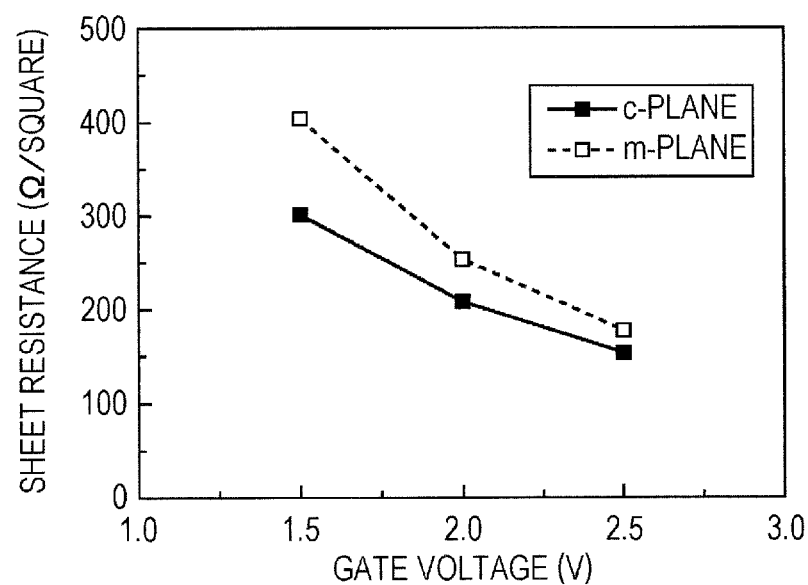

FIGS. 5A and 5B illustrate results of the calculation. FIG. 5A is a graph illustrating the relationship between a sheet resistance and gate voltage under the following conditions: electron transit layer: intrinsic GaN, electron supply layer: n-type $Al_{0.3}Ga_{0.7}N$ (n-type dopant concentration: $1\times10^{13}/cm^3$) and 40 nm thickness, and gate voltage: 1.5 to 2.5 V. FIG. 5B is a graph illustrating the relationship between sheet resistance and gate voltage under the following conditions: electron transit layer: n-type GaN (n-type dopant concentration: $1\times10^{17}/cm^3$) and electron supply layer: intrinsic $Al_{0.3}Ga_{0.7}N$ and 40 nm thickness.

It is clear from FIGS. 5A and 5B that on-resistance is significantly reduced in the AlGaN/GaN-HEMT of the first embodiment as compared with an existing AlGaN/GaN-HEMT having a lateral structure and the same channel length. In particular, on-resistance is approximately 15 to 30% smaller in the AlGaN/GaN-HEMT of the first embodiment than in such an existing AlGaN/GaN-HEMT.

As described above, in the first embodiment, operation in a normally-off mode is enabled with a relatively simple configuration, on-resistance is decreased, and the horizontal distance between the gate electrode 7 and the drain electrode 6 is reduced as much as possible to enable sufficiently high integration. The AlGaN/GaN-HEMT provided in the first embodiment consequently has high reliability and withstand voltage.

Modification

A modification of the first embodiment will now be described. Although the present modification discloses a Schottky-type AlGaN/GaN-HEMT similarly to the first embodiment, the present modification is different from the first embodiment in terms of the structure of a compound semiconductor region. FIGS. 6A to 7C are schematic cross-sectional views each illustrating a method for manufacturing the AlGaN/GaN-HEMT of the present modification in the process sequence. Although not illustrated, an isolation structure is formed in an isolation region by injection of argon (Ar) or another material.

Figure 6A:
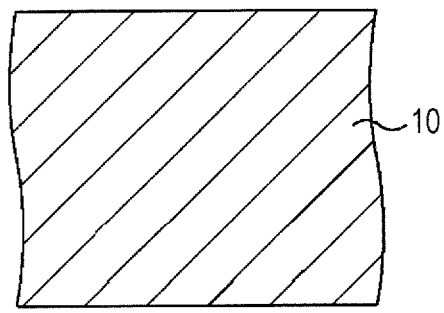
FIGS. 6A to 6C are schematic cross-sectional views each illustrating a process for manufacturing an AlGaN/GaN-HEMT according to a modification of the first embodiment in sequence.

As illustrated in FIG. 6A, a GaN substrate 10 having an upper surface (one principle plane) that is an m-plane is used as a growth substrate. A GaN substrate having an upper surface that is an a-plane may be used. Since a protrusion will be formed in the subsequent process, the GaN substrate 10 to be used has a thickness of not less than approximately several tens of micrometers.

Figure 6B:
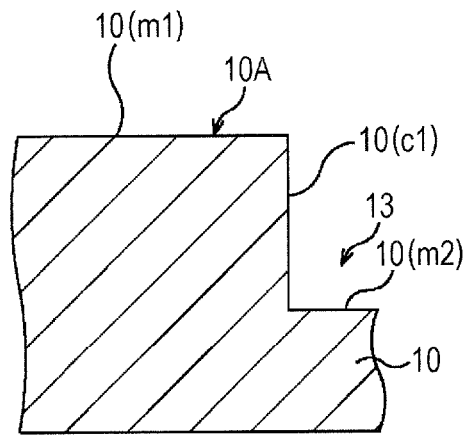

Then, as illustrated in FIG. 6B, a protrusion 10A that serves as a step is formed at the surface of the GaN substrate 10. In particular, a region of the GaN substrate 10 on which the drain electrode is to be formed is dry-etched to form a groove 13 having a depth of approximately 10 μm. Examples of the etching gas used in such dry etching include $BCl_3$ and $Cl_2$. The formation of the groove 13 in the surface of the GaN substrate 10 generates the protrusion 10A at this surface, the protrusion 10A serving as the step. In the present modification, the protrusion 10A of the GaN substrate 10 functions as an electron transit layer. On the basis of the definition of the plane orientation in FIG. 3, among the surfaces of the GaN substrate 10, the upper surface of the protrusion 10A is an m-plane 10 (m1), the bottom of the groove 13 is an m-plane 10 (m2), and the side surface of the groove 13 (side surface of the protrusion 10A) is a c-plane 10 (c1).

Figure 6C:
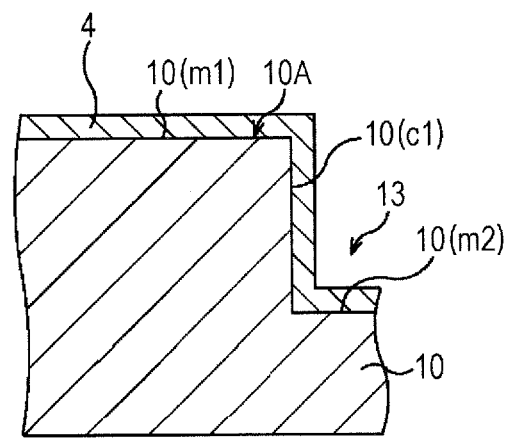

Then, as illustrated in FIG. 6C, the electron supply layer 4 is formed on the GaN substrate 10. In particular, i-AlGaN (intrinsic AlGaN) or n-AlGaN (n-type AlGaN) is grown on the GaN substrate 10 by MOVPE or another technique to a thickness of approximately 40 nm. In the present modification, a layer of i-AlGaN or n-AlGaN is formed on the GaN substrate 10 so as to have an upper surface (upper surface parallel to the upper surface of the protrusion 10A) that is an m-plane. If the GaN substrate 10 is formed so as to have an upper surface that is an a-plane, the upper surface of the electron supply layer 4 is also an a-plane. In the present modification, a compound semiconductor region including the GaN substrate 10 and the electron supply layer 4 is formed.

In the growth of AlGaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of the composition of AlGaN ($Al_x(Ga_{1-x}N$: $0<x<1$). The flow rate of ammonia gas is approximately 100 ccm to 10 LM. Furthermore, the growth pressure is approximately 50 to 300 Torr, and the growth temperature is approximately 1000 to 1200° C.

In order to grow n-type AlGaN, for instance, a gas containing an n-type dopant such as Si (for example, $SiH_4$ gas) is added to the mixed gas at a predetermined flow rate to dope AlGaN with Si. The concentration of Si as a dopant is, for instance, approximately $1\times10^{13}/cm^3$.

Figure 7A:
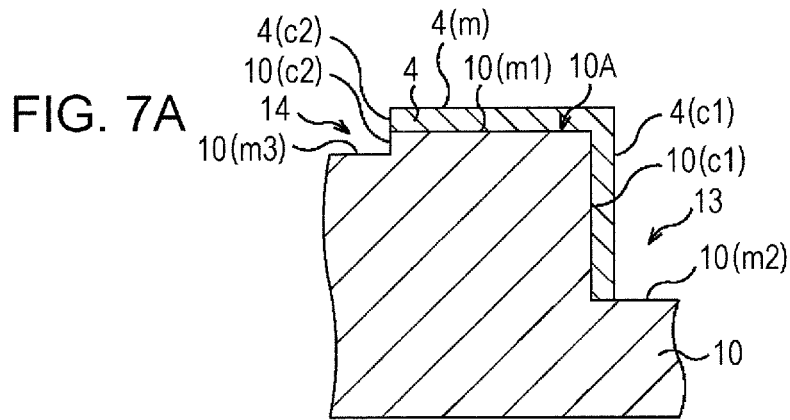
FIGS. 7A to 7C are schematic cross-sectional views each illustrating the subsequent process for manufacturing the AlGaN/GaN-HEMT according to the modification of the first embodiment in sequence.

Then, as illustrated in FIG. 7A, parts of the electron supply layer 4 are dry-etched, and part of the protrusion 10A is subsequently dry-etched. In particular, the electron supply layer 4 is dry-etched to expose the bottom of the groove 13 and a region of the protrusion 10A on which the source electrode is to be formed. In the dry etching, for example, $Cl_2$ or another material is employed as the etching gas (or simultaneous use of $Cl_2$ and $SF_6$). Then, the exposed region of the protrusion 10A on which the source electrode is to be formed is dry-etched to form a groove 14 having a depth of approximately 1 μm. Examples of the etching gas used in such dry etching include $BCl_3$ and $Cl_2$. On the basis of the definition of the plane orientation in FIG. 3, in the GaN substrate 10, the bottom of the groove 14 is an m-plane 10 (m3), and the side surface of the groove 14 (side surface of the protrusion 10A) is a c-plane 10 (c2). In the electron supply layer 4, the upper surface is the m-plane 4 (m), one side surface is the c-plane 4 (c1), and the other side surface is the c-plane 4 (c2).

Figure 7B:
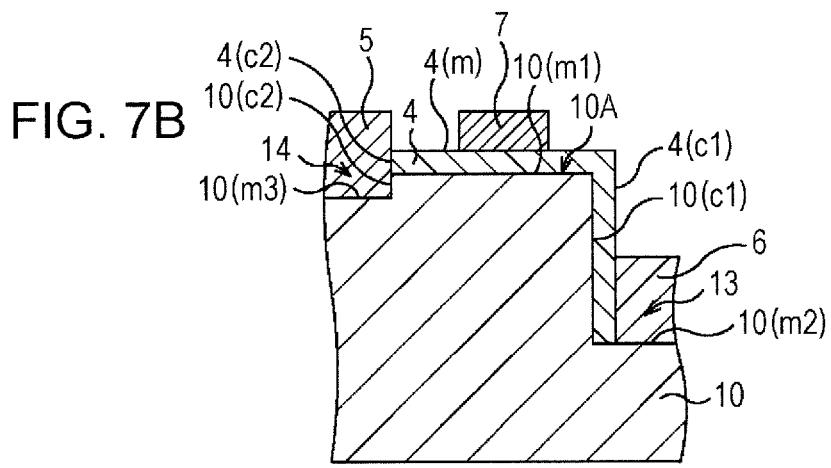

Then, as illustrated in FIG. 7B, the source electrode 5, the drain electrode 6, and the gate electrode 7 are formed. In particular, the source electrode 5 is formed in the groove 14, and then the drain electrode 6 is formed in the groove 13. A resist mask used for forming the source electrode 5 and the drain electrode 6 is formed. A resist is applied onto an entire surface of the product, and then openings in which the grooves 14 and 13 are exposed are formed by a lithographic technique. In this manner, a resist mask having such openings is formed. An electrode material such as Ta/Al is deposited by, for example, a vapor deposition technique on the resist mask and in the openings in which the grooves 14 and 13 are exposed. Ta is deposited to a thickness of approximately 20 nm, and Al is deposited to a thickness of approximately 200 nm. The resist mask and Ta/Al deposited thereon are removed by a lift-off technique. Then, the GaN substrate 10 is heated, for example, under a nitrogen atmosphere at approximately 400 to 1000° C., such as approximately 600° C., and the remaining Ta/Al is brought into ohmic contact with the GaN substrate 10 and the electron supply layer 4. The heating need not be carried out in some cases provided that Ta/Al is brought into ohmic contact with the GaN substrate 10 and the electron supply layer 4. In this manner, the source electrode 5 and the drain electrodes 6 are formed by filling the grooves 14 and 13 with part of the electrode material, respectively.

The bottom of the source electrode 5 is in ohmic contact with the m-plane 10 (m3) of the GaN substrate 10, and the side surface of the source electrode 5 is in ohmic contact with the c-plane 10 (c2) of the GaN substrate 10 and the c-plane 4 (c2) of the electron supply layer 4. The bottom of the drain electrode 6 is in ohmic contact with the m-plane 10 (m2) of the GaN substrate 10, and the side surface of the drain electrode 6 is in ohmic contact with the c-plane 4 (c1) of the electron supply layer 4.

Then, the gate electrode 7 is formed on the m-plane 4 (m) of the electron supply layer 4. A resist mask used for forming the gate electrode 7 is formed. A resist is applied onto an entire surface of the product, and then an opening used for exposing a region of the m-plane 4 (m) of the electron supply layer 4 on which the gate electrode 7 is to be formed is formed by a lithographic technique. In this manner, a resist mask having such an opening is formed.

An electrode material such as Ni/Au is deposited on the resist mask and in the opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 7 is formed on the m-plane 4 (m) of the electron supply layer 4 while Schottky contact is established therebetween.

Figure 7C:
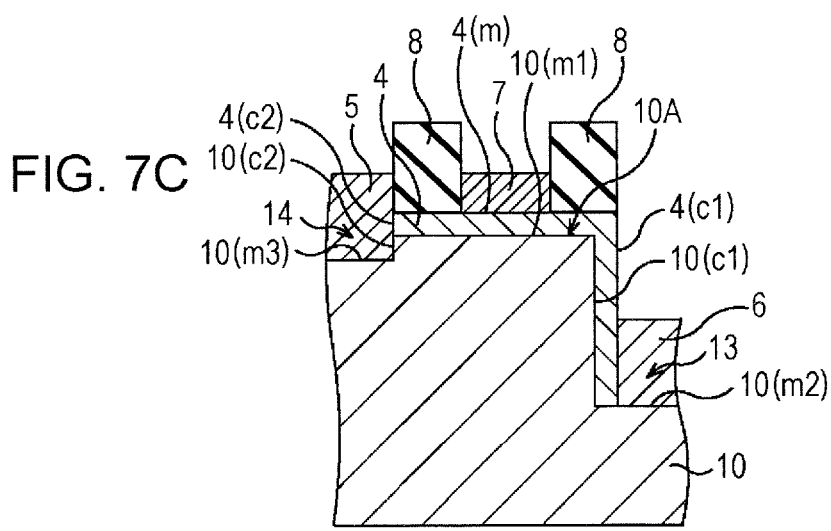

Then, as illustrated in FIG. 7C, the insulating film 8 is formed. In particular, an insulating material such as silicon oxide is deposited on an entire surface of the product by, for instance, a CVD method. The deposited silicon oxide is processed by a lithographic technique and dry etching. In this manner, the insulating film 8 is formed so as to have openings above the source electrode 5, the drain electrode 6, and the gate electrode 7 to expose these electrodes.

Then, manufacturing of the AlGaN/GaN-HEMT of the present modification is completed through processes, for example, for providing wiring connected to the source electrode 5, the drain electrode 6, and the gate electrode 7.

Figure 8A:
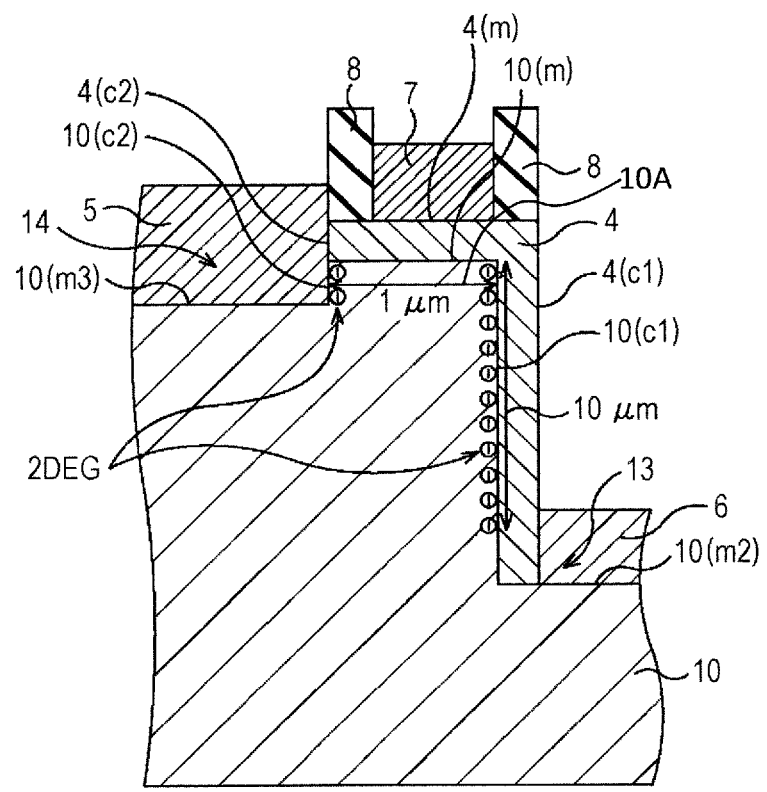
FIGS. 8A and 8B each schematically illustrate the AlGaN/GaN-HEMT according to the modification of the first embodiment.
Figure 8B:
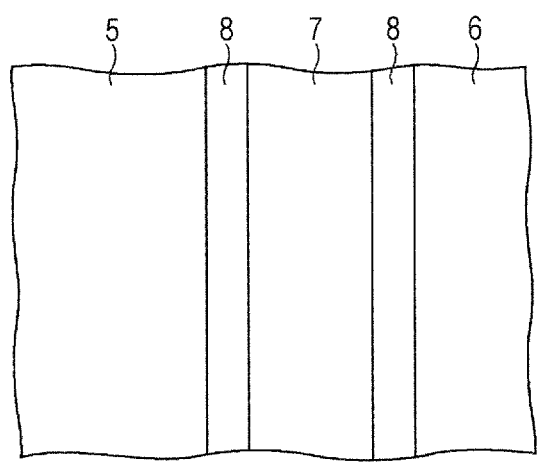

FIGS. 8A and 8B are a schematic cross-sectional view and a schematic plan view illustrating the AlGaN/GaN-HEMT of the present modification, respectively. The AlGaN/GaN-HEMT has a lateral structure between the gate electrode 7 and the source electrode 5 and a longitudinal structure between the gate electrode 7 and the drain electrode 6. The gate electrode 7 and the source electrode 5 are spaced apart from each other in a lateral direction (horizontal direction) along the upper surface of the protrusion 10A, and the gate electrode 7 and the drain electrode 6 are spaced apart from each other in a longitudinal direction (vertical direction) along the side surface of the protrusion 10A.

In the AlGaN/GaN-HEMT of the present modification, a channel is formed in the protrusion 10A along the interface to the electron supply layer 4 and between the source electrode 5 and the drain electrode 6. The gate electrode 7 is formed on the m-plane 4 (m) of the electron supply layer 4. Since part of the channel between the gate electrode 7 and the source electrode 5, which includes the region below the gate electrode 7, is formed along the m-plane of the protrusion 10A being a non-polar face, 2DEG is not generated in this part in a state in which gate voltage is not applied. In contrast, since part of the channel between the gate electrode 7 and the drain electrode 6 is formed along the c-plane of the protrusion 10A being a polar face, high-concentration 2DEG is generated in this part even in a state in which gate voltage is not applied. Operation in a normally-off mode is therefore steadily enabled.

In the AlGaN/GaN-HEMT of the modification, part of the channel between the gate electrode 7 and the drain electrode 6 is formed along the c-plane of the protrusion 10A. On-resistance is therefore greatly reduced as compared with a case in which part of a channel between a gate electrode and a drain electrode is formed along an m-plane.

In the AlGaN/GaN-HEMT of the present modification, the source electrode 5 is formed so as to be embedded in the groove 14 of the protrusion 10A and contacts the c-plane 10 (c2) of the GaN substrate 10. In the protrusion 10A, 2DEG is also generated on the c-plane 10 (c2) at the interface to the electron supply layer 4. The source electrode 5 contacts this 2DEG, so that stable ohmic contact is established.

In the AlGaN/GaN-HEMT of the present embodiment, part of the channel between the gate electrode 7 and the drain electrode 6 is formed in the vertical structure, in other words, along the side surface of the protrusion 10A. Even if the length $L_{gd}$ between the gate electrode 7 and the drain electrode 6 in a vertical direction is increased to exhibit high withstand voltage, the length between the gate electrode 7 and the drain electrode 6 in a horizontal direction is equivalent to the thickness of the electron supply layer 4 at most and is therefore negligible. Thus, when the device is seen in plane view, an area occupied by the device is substantially greatly reduced, which enables integration of a large number of devices.

The specific integration density of devices is described. Assuming that part of the channel between the gate electrode 7 and the source electrode 5 is 1 μm in length, the length of the channel is substantially equivalent to 1 μm in plane view. Assuming that the length $L_{gd}$ between the gate electrode 7 and the drain electrode 6 in the vertical direction is 10 μm, the withstand voltage is approximately 1000 V. In order to exhibit a withstand voltage of approximately 1000 V in existing AlGaN/GaN-HEMTs each having a lateral structure, a channel has a length of 11 μm (1-μm length between a gate electrode and a source electrode+10-μm length between the gate electrode and a drain electrode). The AlGaN/GaN-HEMT of the present modification accordingly enables the area occupied by a device to be reduced to an approximately eleventh part of the area occupied by such an existing AlGaN/GaN-HEMT having a lateral structure and enables the integration density of devices to be increased approximately 11 times the integration density of the existing AlGaN/GaN-HEMTs. In the case where a withstand voltage of approximately tens of thousands volts is exhibited, the present modification similarly enables the area occupied by a device to be reduced to an approximately several hundredth part of the area occupied by an existing device and enables the integration density of devices to be increased approximately several hundred times the integration density of existing devices.

As in the first embodiment, on-resistance is approximately 15 to 30% smaller in the AlGaN/GaN-HEMT of the present modification than in existing AlGaN/GaN-HEMTs each having a lateral structure and the same channel length.

As described above, in the present modification, operation in a normally-off mode is enabled with a relatively simple configuration, on-resistance is decreased, and the horizontal distance between the gate electrode 7 and the drain electrode 6 is reduced as much as possible to enable sufficiently high integration. The AlGaN/GaN-HEMT provided in the present modification consequently has high reliability and withstand voltage. Furthermore, in the present modification, a buffer layer is not provided, and an electron transit layer is also not provided while part of the GaN substrate serves as an electron transit layer. This configuration effectively decreases the number of production processes.

Second Embodiment

A second embodiment will now be described. Although the second embodiment discloses a Schottky-type AlGaN/GaN-HEMT similarly to the first embodiment, the second embodiment is different from the first embodiment in terms of the structure of a step formed in an electron transit layer. FIGS. 9A to 11B are schematic cross-sectional views each illustrating a method for manufacturing the AlGaN/GaN-HEMT of the second embodiment in the process sequence. Although not illustrated, an isolation structure is formed in an isolation region by injection of argon (Ar) or another material.

Figure 9A:
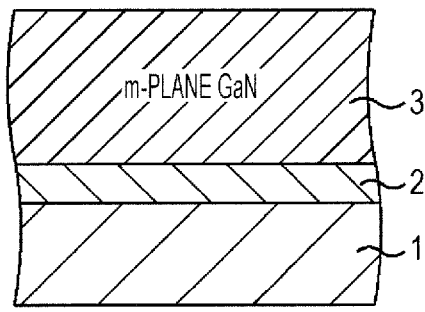
FIGS. 9A to 9C are schematic cross-sectional views each illustrating a process for manufacturing an AlGaN/GaN-HEMT according to a second embodiment in sequence.

As illustrated in FIG. 9A, the buffer layer 2 and electron transit layer 3 that are compound semiconductor layers are formed on a growth substrate such as an m-plane SiC substrate (hereinafter referred to as SiC substrate) 1 in sequence as in the first embodiment in FIG. 1A. In place of the m-plane SiC substrate, a sapphire substrate or a GaAs substrate may be used as a growth substrate. The substrate may be a semi-insulating substrate or a conductive substrate.

AlN is grown on the SiC substrate 1 to a thickness of approximately 5 nm, and i-GaN (intrinsic GaN) or n-GaN (n-type GaN) is grown thereon to a thickness of approximately one to several tens of micrometers, the growth being carried out by, for example, MOVPE. In the second embodiment, the layer of i-GaN or n-GaN is formed above the SiC substrate 1 so as to have a surface (upper surface parallel to the upper surface of the SiC substrate 1) that is an m-plane being a non-polar face. Instead of an m-plane, such a layer may be formed so as to have an a-plane. In this manner, the buffer layer 2 and the electron transit layer 3 having an upper surface that is an m-plane are formed so as to overlie the SiC substrate 1. In the formation of the buffer layer 2, AlGaN may replace AlN, or GaN may be grown at low temperature. A GaN substrate may be employed as the growth substrate, and the electron transit layer 3 may be formed on the GaN substrate without forming the buffer layer 2.

In the growth of AlN and GaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of a compound semiconductor layer to be grown. The flow rate of ammonia gas that is the common material is approximately 100 ccm to 10 LM. Furthermore, for instance, the growth pressure is approximately 50 to 300 Torr, and the growth temperature is approximately 1000 to 1200° C.

In order to grow n-type GaN, for instance, a gas containing an n-type dopant such as Si (for example, $SiH_4$ gas) is added to the mixed gas at a predetermined flow rate to dope GaN with Si. The concentration of Si as a dopant is, for instance, approximately $1 \times 10^{17}/cm^3$.

Figure 9B:
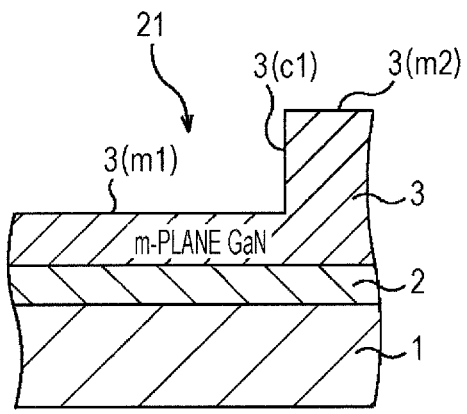

Then, as illustrated in FIG. 9B, a recess 21 that serves as a step is formed in the surface of the electron transit layer 3. In particular, part of the surface of the electron transit layer 3 other than a region on which the drain electrode is to be formed is dry-etched to form a groove having a depth of approximately one to several tens of micrometers (value determined by withstand voltage; for instance, the thickness will be several micrometers for a withstand voltage of several hundred volts and will be several tens of micrometers for a withstand voltage of several thousand volts). Examples of the etching gas used in such dry etching include BCl$_3$ and Cl$_2$. The groove formed in the surface of the electron transit layer 3 is the recess 21 that serves as a step. On the basis of the definition of the plane orientation in FIG. 3, among the surfaces of the electron transit layer 3, the bottom of the recess 21 is the m-plane 3 (*m*1), the upper surface of the electron transit layer 3 is the m-plane 3 (*m*2), and the side surface of the recess 21 is a c-plane 3 (*c*).

Figure 9C:
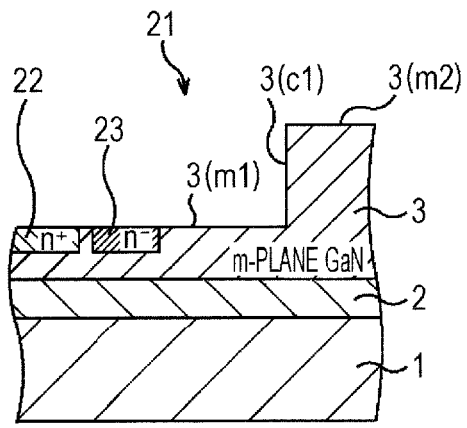

Then, as illustrated in FIG. 9C, an n$^+$ region 22 and an n$^-$ region 23 are formed at the bottom of the recess 21. In particular, a resist is applied onto an entire surface of the product, and the resist is processed by a lithographic technique to form a resist mask having an opening used for exposing a region at the bottom of the recess 21 on which the source electrode is to be formed. The bottom of the recess 21 is doped with an n-type dopant, such as Si, with this resist mask. The concentration of Si as a dopant is, for example, approximately not less than $1 \times 10^{18}/cm^3$: for instance, approximately $1 \times 10^{20}/cm^3$. In this manner, the n$^+$ region 22 is formed in part of the bottom of the recess 21 on which the source electrode is to be formed. The resist mask is removed by an ashing process or another technique.

Then, a resist is applied onto an entire surface of the product, and the resist is processed by a lithographic technique to form a resist mask having an opening used for exposing a predetermined region at the bottom of the recess 21 between parts on which the gate electrode and the source electrode are to be formed. The bottom of the recess 21 is doped with an n-type dopant, such as Si, with this resist mask. The concentration of Si as a dopant is lower than that of the n$^+$ region 22: for example, approximately not more than $1 \times 10^{17}/cm^3$, in particular, approximately $1 \times 10^{16}/cm^3$. In this manner, the n$^-$ region 23 is formed in a predetermined part of the bottom of the recess 21 between parts on which the gate electrode and the source electrode are to be formed. The resist mask is removed by an ashing process or another technique.

Figure 10A:
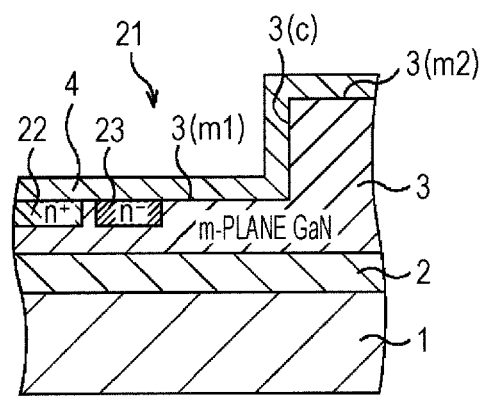
FIGS. 10A and 10B are schematic cross-sectional views each illustrating the subsequent process for manufacturing the AlGaN/GaN-HEMT according to the second embodiment in sequence.

Then, as illustrated in FIG. 10A, the electron supply layer 4 is formed on the electron transit layer 3. In particular, i-AlGaN (intrinsic AlGaN) or n-AlGaN (n-type AlGaN) is grown on the electron transit layer 3 by MOVPE or another technique to a thickness of approximately 40 nm. In the second embodiment, a layer of i-AlGaN or n-AlGaN is formed on the electron transit layer 3 so as to have an upper surface (upper surface parallel to the upper surface of the SiC substrate 1) that is an m-plane. If the electron transit layer 3 is formed so as to have an upper surface that is an a-plane, the upper surface of the electron supply layer 4 is also an a-plane. In this manner, a compound semiconductor region including the buffer layer 2, the electron transit layer 3, and the electron supply layer 4 is formed.

In the growth of AlGaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of the composition of AlGaN (Al$_x$Ga$_{1-x}$N: 0<x<1). The flow rate of ammonia gas is approximately 100 ccm to 10 LM. Furthermore, for instance, the growth pressure is approximately 50 to 300 Torr, and the growth temperature is approximately 1000 to 1200° C.

In order to growth n-type AlGaN, for instance, a gas containing an n-type dopant such as Si (for example, SiH$_4$ gas) is added to the mixed gas at a predetermined flow rate to dope AlGaN with Si. The concentration of Si as a dopant is, for instance, approximately $1 \times 10^{13}/cm^3$.

Figure 10B:
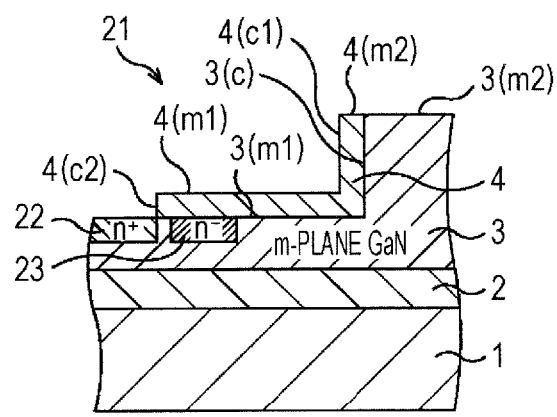

Then, as illustrated in FIG. 10B, part of the electron supply layer 4 is dry-etched. In particular, the electron supply layer 4 is dry-etched to expose the surface of the n$^+$ region 22 and a region on the upper surface of the electron transit layer 3 on which the drain electrode is to be formed. In such dry etching, for example, Cl$_2$ or another material is employed as the etching gas (or simultaneous use of Cl$_2$ and SF$_6$). On the basis of the definition of the plane orientation in FIG. 3, in the electron supply layer 4, one upper surface is an m-plane 4 (*m*1), the other upper surface is an m-plane 4 (*m*2), and the side surface is a c-plane 4 (*c*).

Figure 11A:
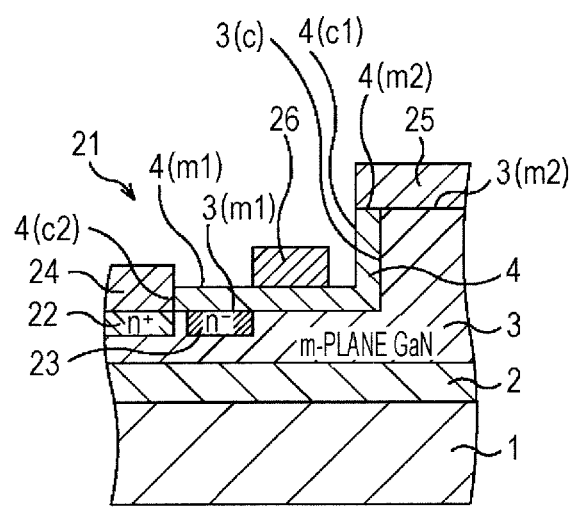
FIGS. 11A and 11B are schematic cross-sectional views each illustrating the subsequent process for manufacturing the AlGaN/GaN-HEMT according to the second embodiment in sequence.

Then, as illustrated in FIG. 11A, a source electrode 24, a drain electrode 25, and a gate electrode 26 are formed. In particular, the source electrode 24 is formed on the n$^+$ region 22, and the drain electrode 25 is formed on a region including the upper surface of the electron transit layer 3 and the above-mentioned other upper surface of the electron supply layer 4. A resist mask used for forming the source electrode 24 and the drain electrode 25 is formed. A resist is applied onto an entire surface of the product, and then openings in which the surface of the n$^+$ region 22 and the above-mentioned region are exposed are formed by a lithographic technique. In this manner, a resist mask having such openings is formed. An electrode material such as Ta/Al is deposited on the resist mask and in the openings used for exposing the surface of the n$^+$ region 22 and the above-mentioned region by, for example, a vapor deposition technique. Ta is deposited to a thickness of approximately 20 nm, and Al is deposited to a thickness of approximately 200 nm. The resist mask and Ta/Al deposited thereon are removed by a lift-off technique. Then, the SiC substrate 1 is heated, for instance, under a nitrogen atmosphere at approximately 400 to 1000° C., for example approximately 600° C., and the remaining Ta/Al is brought into ohmic contact with the electron transit layer 3 and the electron supply layer 4. The heating need not be carried out in some cases provided that Ta/Al is brought into ohmic contact with the electron transit layer 3 and the electron supply layer 4. Through this process, the source electrode 24 and the drain electrode 25 are formed on the surface of the n$^+$ region 22 and the above-mentioned region, respectively.

The bottom of the source electrode 24 is in ohmic contact with the n$^+$ region 22 [m-plane 3 (*m*1)], and the side surface of the source electrode 24 is in ohmic contact with the c-plane 4 (*c*2) of the electron supply layer 4. In the second embodiment, since the source electrode 24 contacts the n$^+$ region 22, good ohmic contact is established. The bottom of the drain electrode 25 is in ohmic contact with the m-plane 3 (*m*2) of the electron transit layer 3 and the m-plane 4 (*m*2) of the electron supply layer 4.

Then, the gate electrode 26 is formed on the m-plane 4 (*m*1) of the electron supply layer 4. A resist mask used for forming the gate electrode 26 is formed. A resist is applied onto an entire surface of the product, and then an opening used for exposing a region of the m-plane 4 (*m*1) of the electron supply layer 4 on which the gate electrode 26 is to be formed is formed by a lithographic technique. In this manner, a resist mask having such an opening is formed.

An electrode material such as Ni/Au is deposited on the resist mask and in the opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 26 is formed on the m-plane 4 (*m*1) of the electron supply layer 4 while a Schottky contact is established therebetween.

In the second embodiment, the n⁻ region 23 is formed in a predetermined part of the electron supply layer 4 between the gate electrode 26 and the source electrode 24. The n⁻ region 23 serves for a further enhancement in withstand voltage.

Figure 11B:
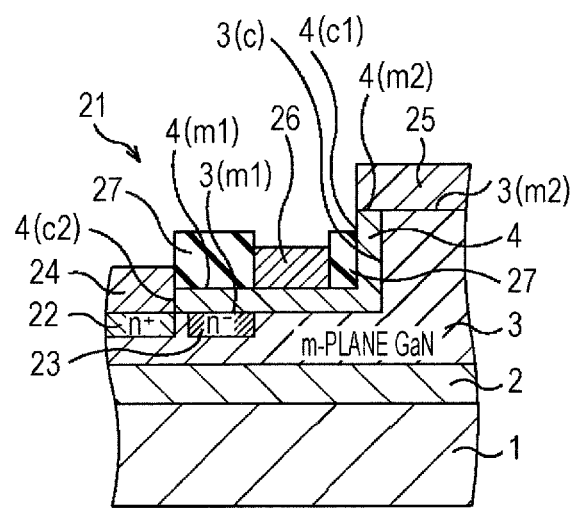

Then, as illustrated in FIG. 11B, an insulating film 27 is formed. In particular, an insulating material such as silicon oxide is deposited on an entire surface of the product by, for instance, a CVD method. The deposited silicon oxide is processed by a lithographic technique and dry etching. In this manner, the insulating film 27 is formed so as to have openings above the source electrode 24, the drain electrode 25, and the gate electrode 26 to expose these electrodes.

Then, manufacturing of the AlGaN/GaN-HEMT of the second embodiment is completed through processes for providing wiring connected to the source electrode 24, the drain electrode 25, and the gate electrode 26.

Figure 12A:
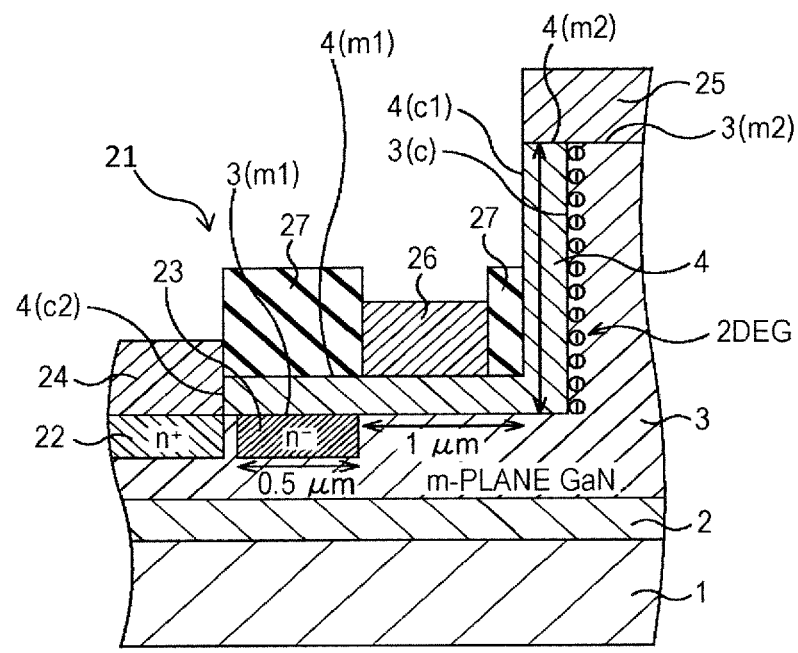
FIGS. 12A and 12B each schematically illustrate the AlGaN/GaN-HEMT according to the second embodiment.
Figure 12B:
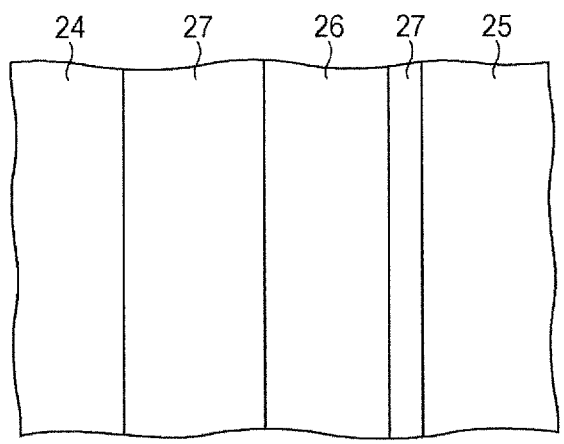

FIGS. 12A and 12B are a schematic cross-sectional view and a schematic plan view illustrating the AlGaN/GaN-HEMT of the second embodiment, respectively. The AlGaN/GaN-HEMT has a lateral structure between the gate electrode 26 and the source electrode 24 and a longitudinal structure between the gate electrode 26 and the drain electrode 25. The gate electrode 26 and the source electrode 24 are spaced apart from each other in a lateral direction (horizontal direction) along the bottom of the recess 21, and the gate electrode 26 and the drain electrode 25 are spaced apart from each other in a longitudinal direction (vertical direction) along the side surface of the recess 21.

In the AlGaN/GaN-HEMT of the second embodiment, a channel is formed in the electron transit layer 3 along the interface to the electron supply layer 4 and between the source electrode 24 and the drain electrode 25. The gate electrode 26 is formed on the m-plane 4 ($m$1) of the electron supply layer 4. Since part of the channel between the gate electrode 26 and the source electrode 24, which includes the region below the gate electrode 26, is formed along the m-plane of the recess 21 being a non-polar face, 2DEG is not generated in this part in a state in which gate voltage is not applied. In contrast, since part of the channel between the gate electrode 26 and the drain electrode 25 is formed along the c-plane of the recess 21 being a polar face, high-concentration 2DEG is generated in this part even in a state in which gate voltage is not applied. Operation in a normally-off is therefore steadily enabled.

In the AlGaN/GaN-HEMT of the second embodiment, part of the channel between the gate electrode 26 and the drain electrode 25 is formed along the c-plane of the recess 21. On-resistance is therefore greatly reduced as compared with a case in which part of a channel between a gate electrode and a drain electrode is formed along an m-plane.

In the AlGaN/GaN-HEMT of the second embodiment, the source electrode 24 is formed on the n⁺ region 22 of the electron transit layer 3 such that contact is established therebetween. This structure enables stable ohmic contact to be established between the source electrode 24 and the electron transit layer 3.

In the AlGaN/GaN-HEMT of the second embodiment, part of the channel between the gate electrode 26 and the drain electrode 25 is formed in the longitudinal structure, in other words, along the side surface of the recess 21. Even if the length $L_{gd}$ between the gate electrode 26 and the drain electrode 25 in a vertical direction is increased to exhibit high withstand voltage, the length between the gate electrode 26 and the drain electrode 25 in a horizontal direction is equivalent to the thickness of the insulating film 27 at most and is therefore negligible. Thus, when the device is seen in plan view, an area occupied by the device is substantially greatly reduced, which enables integration of a large number of devices.

The specific integration density of devices is described. Assuming that part of the channel between the gate electrode 26 and the source electrode 25 is 1.5 μm (1 μm+0.5 μm), the length of the channel is substantially equivalent to 1.5 μm in plan view. Assuming that the length $L_{gd}$ between the gate electrode 26 and the drain electrode 25 in the vertical direction is 10 μm, the withstand voltage is approximately 1000 V. In order to exhibit a withstand voltage of approximately 1000 V in existing AlGaN/GaN-HEMTs each having a lateral structure, a channel has a length of 11.5 μm (1.5-μm length between a gate electrode and a source electrode+10-μm length between the gate electrode and a drain electrode). The AlGaN/GaN-HEMT of the second embodiment accordingly enables the area occupied by a device to be reduced to an approximately eighth part of the area occupied by such an existing AlGaN/GaN-HEMT having a lateral structure and enables the integration density of devices to be increased approximately eight times the integration density of the existing AlGaN/GaN-HEMTs. In the case where a withstand voltage of approximately tens of thousands volts is exhibited, the second embodiment similarly enables the area occupied by a device to be reduced to an approximately several hundredth part of the area occupied by an existing device and enables the integration density of devices to be increased approximately several hundred times the integration density of existing devices.

As in the first embodiment, on-resistance is approximately 15 to 30% smaller in the AlGaN/GaN-HEMT of the second embodiment than in existing AlGaN/GaN-HEMTs each having a lateral structure and the same channel length.

As described above, in the second embodiment, operation in a normally-off mode is enabled with a relatively simple configuration, on-resistance is decreased, and the horizontal distance between the gate electrode 26 and the drain electrode 25 is reduced as much as possible to enable sufficiently high integration. The AlGaN/GaN-HEMT provided in the second embodiment consequently has high reliability and withstand voltage.

Modification

A modification of the second embodiment will now be described. Although the present modification discloses an AlGaN/GaN-HEMT similarly to the second embodiment, the modification is different from the second embodiment in that a metal insulator semiconductor (MIS) device including a gate insulator is provided. FIGS. 13A to 15B are schematic cross-sectional views each illustrating a method for manufacturing the AlGaN/GaN-HEMT of the present modification in the process sequence. Although not illustrated, an isolation structure is formed in an isolation region by injection of argon (Ar) or another material.

Figure 13A:
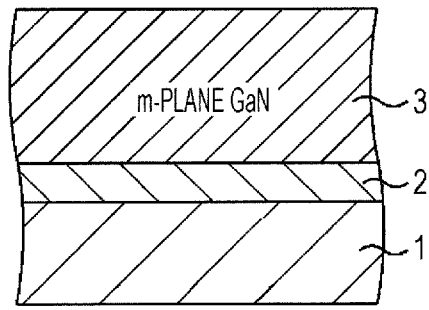
FIGS. 13A to 13C are schematic cross-sectional views each illustrating a process for manufacturing an AlGaN/GaN-HEMT according to a modification of the second embodiment in sequence.

As illustrated in FIG. 13A, the buffer layer 2 and the electron transit layer 3 that are compound semiconductor layers are formed on a growth substrate such as an m-plane SiC substrate (hereinafter referred to as SiC substrate) 1 in sequence as in the second embodiment in FIG. 9A. In place of the m-plane SiC substrate, a sapphire substrate or a GaAs substrate may be used as a growth substrate. The substrate may be a semi-insulating substrate or a conductive substrate.

AlN is grown on the SiC substrate 1 to a thickness of approximately 5 nm, and i-GaN (intrinsic GaN) or n-GaN (n-type GaN) is grown thereon to a thickness of approximately 1 μm, the growth being carried out by, for example, MOVPE. In the present modification, the layer of i-GaN or n-GaN is formed above the SiC substrate 1 so as to have a surface (upper surface parallel to the upper surface of the SiC substrate 1) that is an m-plane being a non-polar face. Instead of an m-plane, such a layer may be formed so as to have an a-plane. In this manner, the buffer layer 2 and the electron transit layer 3 each having an upper surface that is an m-plane are formed so as to overlie the SiC substrate 1. In the formation of the buffer layer 2, AlGaN may replace AlN, or GaN may be grown at low temperature. A GaN substrate may be employed as a growth substrate, and the electron transit layer 3 may be formed on the GaN substrate without forming the buffer layer 2.

In the growth of AlN and GaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of a compound semiconductor layer to be grown. The flow rate of ammonia gas that is the common material is approximately 100 ccm to 10 LM. Furthermore, for instance, the growth pressure is approximately 50 to 300 Torr, and the growth temperature is approximately 1000 to 1200° C.

In order to grow n-type GaN, for instance, a gas containing an n-type dopant such as Si (for example, $SiH_4$ gas) is added to the mixed gas at a predetermined flow rate to dope GaN with Si. The concentration of Si as a dopant is, for instance, approximately $1 \times 10^{17}/cm^3$.

Figure 13B:
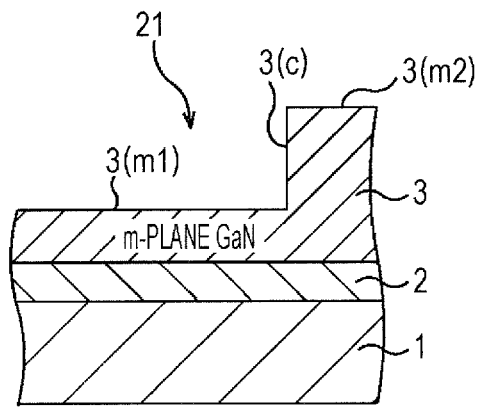

Then, as illustrated in FIG. 13B, the recess 21 that serves as a step is formed in the surface of the electron transit layer 3 as in the second embodiment in FIG. 9B. In particular, part of the surface of the electron transit layer 3 other than a region on which the drain electrode is to be formed is dry-etched to form a groove having a depth of approximately one to several tens of micrometers (value determined by withstand voltage; for instance, the thickness will be several micrometers for a withstand voltage of several hundred volts and will be several tens of micrometers for a withstand voltage of several thousand volts). Examples of the etching gas used in such dry etching include $BCl_3$ and $Cl_2$. The groove formed in the surface of the electron transit layer 3 is the recess 21 that serves as a step. On the basis of the definition of the plane orientation in FIG. 3, among the surfaces of the electron transit layer 3, the bottom of the recess 21 is the m-plane 3 (*m*1), the upper surface of the electron transit layer 3 is the m-plane 3 (*m*2), and the side surface of the recess 21 is the c-plane 3 (*c*).

Figure 13C:
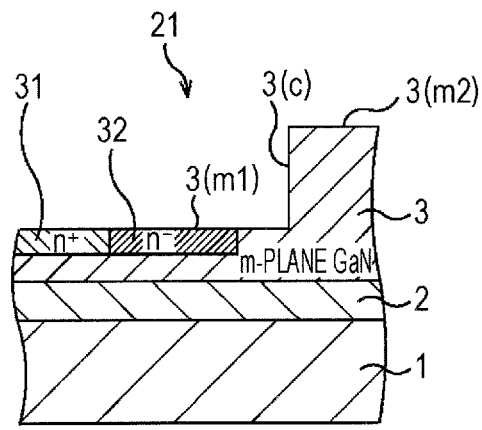

Then, as illustrated in FIG. 13C, an $n^+$ region 31 and an $n^-$ region 32 are formed at the bottom of the recess 21. In particular, a resist is applied onto an entire surface of the product, and the resist is processed by a lithographic technique to form a resist mask having an opening used for exposing a region at the bottom of the recess 21 on which the source electrode is to be formed. The bottom of the recess 21 is doped with an n-type dopant, such as Si, with this resist mask. The concentration of Si as a dopant is, for example, approximately not less than $1 \times 10^{18}/cm^3$: for instance, approximately $1 \times 10^{20}/cm^3$. In this manner, the $n^+$ region 31 is formed in part of the bottom of the recess 21 on which the source electrode is to be formed. The resist mask is removed by an ashing process or another technique.

Then, a resist is applied onto an entire surface of the product, and the resist is processed by a lithographic technique to form a resist mask having an opening used for exposing a region at the bottom of the recess 21 on which the gate electrode is to be formed. The bottom of the recess 21 is doped with an n-type dopant, such as Si, with this resist mask. The concentration of Si as a dopant is lower than that of the $n^+$ region 31: for example, approximately not more than $1 \times 10^{17}/cm^3$, in particular, approximately $1 \times 10^{16}/cm^3$. In this manner, then region 32 is formed in part of the bottom of the recess 21 on which the gate electrode is to be formed. The resist mask is removed by an ashing process or another technique.

Figure 14A:
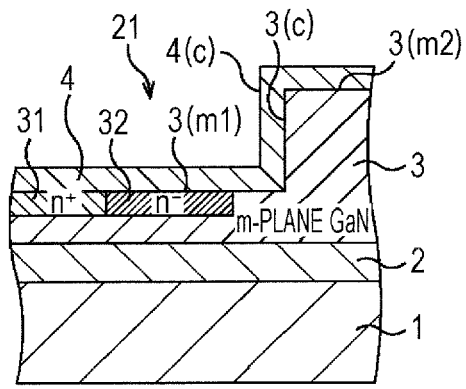
FIGS. 14A to 14C are schematic cross-sectional views each illustrating the subsequent process for manufacturing the AlGaN/GaN-HEMT according to the modification of the second embodiment in sequence.

Then, as illustrated in FIG. 14A, the electron supply layer 4 is formed on the electron transit layer 3. In particular, i-AlGaN (intrinsic AlGaN) or n-AlGaN (n-type AlGaN) is grown on the electron transit layer 3 by MOVPE or another technique to a thickness of approximately 40 nm. In the present modification, the layer of i-AlGaN or n-AlGaN is formed on the electron transit layer 3 so as to have an upper surface (upper surface parallel to the upper surface of the SiC substrate 1) that is an m-plane. If the electron transit layer 3 is formed so as to have an upper surface that is an a-plane, the upper surface of the electron supply layer 4 is also an a-plane. In this manner, a compound semiconductor region including the buffer layer 2, the electron transit layer 3, and the electron supply layer 4 is formed.

In the growth of AlGaN, a mixed gas of trimethylaluminum gas, trimethylgallium gas, and ammonia gas is used as the source gas. Whether to supply trimethylaluminum gas (Al source) and trimethylgallium gas (Ga source) and the flow rate thereof are appropriately determined on the basis of composition of AlGaN ($Al_xGa_{1-x}$ N: 0<x<1). The flow rate of ammonia gas is approximately 100 ccm to 10 LM. Furthermore, the growth pressure is approximately 50 to 300 Torr, and the growth temperature is approximately 1000 to 1200° C.

In order to grow n-type AlGaN, for instance, a gas containing an n-type dopant such as Si (for example, $SiH_4$ gas) is added to the mixed gas at a predetermined flow rate to dope AlGaN with Si. The concentration of Si as a dopant is, for instance, approximately $1 \times 10^{13}/cm^3$.

Figure 14B:
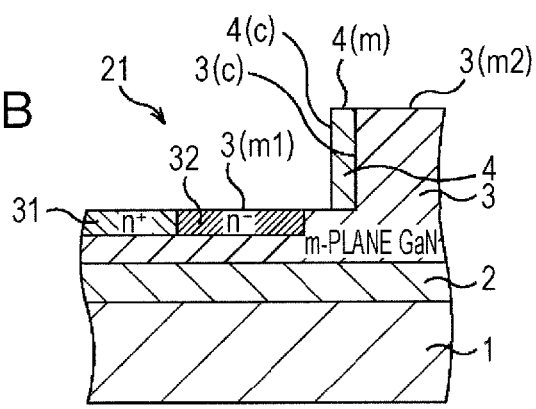

Then, as illustrated in FIG. 14B, the electron supply layer 4 is dry-etched. In particular, the electron supply layer 4 is dry-etched such that part of the electron supply layer 4 only on the side surface of the recess 21 is left. In such dry etching, for example, $Cl_2$ or another material is employed as the etching gas (or simultaneous use of $Cl_2$ and $SF_6$). On the basis of the definition of the plane orientation in FIG. 3, in the electron supply layer 4, the upper surface is the m-plane 4 (*m*), and the side surface is the c-plane 4 (*c*).

Figure 14C:
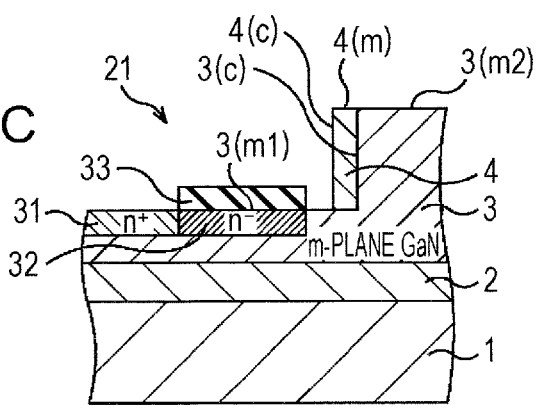

Then, as illustrated in FIG. 14C, a gate insulator 33 is formed. In particular, an insulating material such as $Al_2O_3$ is deposited on an entire surface of the product. $Al_2O_3$ is deposited by, for example, atomic layer deposition (ALD) to a thickness of approximately 2 to 200 nm; in this case, $Al_2O_3$ is deposited to a thickness of approximately 40 nm. Instead of ALD, $Al_2O_3$ may be deposited by, for instance, plasma CVD or sputtering. In place of $Al_2O_3$, nitrides or oxynitrides of Al may be used. Furthermore, in order to form the gate insulator 33, oxides, nitrides, or oxynitrides of Si, Hf, Zr, Ti, Ta, or W may be used, or an appropriate combination thereof may be employed to form a multilayered structure.

Then, the deposited $Al_2O_3$ is processed by a lithographic technique and dry etching to leave $Al_2O_3$ only on the $n^-$ region 32 that is a region on which the gate electrode is to be formed. In this manner, the gate insulator 33 is formed on the $n^-$ region 32.

Figure 15A:
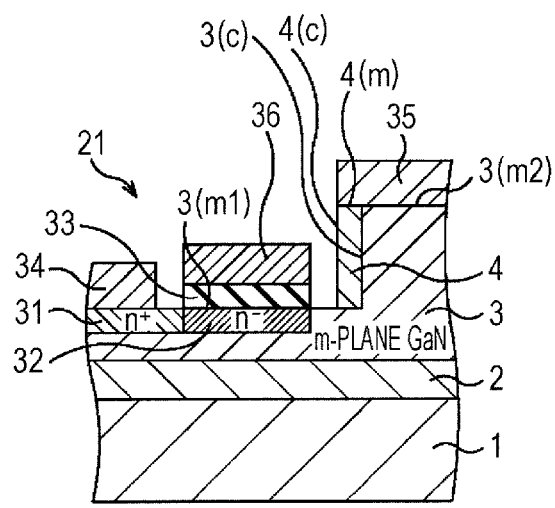
FIGS. 15A and 15B are schematic cross-sectional views each illustrating the subsequent process for manufacturing the AlGaN/GaN-HEMT according to the modification of the second embodiment in sequence.

Then, as illustrated in FIG. 15A, a source electrode 34, a drain electrode 35, and a gate electrode 36 are formed. In particular, the source electrode 34 is formed on the $n^+$ region 31, and the drain electrode 35 is formed in a region including the upper surfaces of the electron transit layer 3 and electron supply layer 4. A resist mask used for forming the source electrode 34 and the drain electrode 35 is formed. A resist is applied onto an entire surface of the product, and then openings used for exposing the surface of the n⁺ region 31 and the above-mentioned region are formed by a lithographic technique. In this manner, a resist mask having such openings is formed. An electrode material such as Ta/Al is deposited on the resist mask and in the openings used for exposing the surface of the n⁺ region 31 and the above-mentioned region by, for example, a vapor deposition technique. Ta is deposited to a thickness of approximately 20 nm, and Al is deposited to a thickness of approximately 200 nm. The resist mask and Ta/Al deposited thereon are removed by a lift-off technique. Then, the SiC substrate 1 is heated, for instance, under a nitrogen atmosphere at approximately 400 to 1000° C., for example approximately 600° C., and the remaining Ta/Al is brought into ohmic contact with the electron transit layer 3 and the electron supply layer 4. The heating need not be carried out in some cases provided that Ta/Al is brought into ohmic contact with the electron transit layer 3 and the electron supply layer 4. Through this process, the source electrode 34 and the drain electrode 35 are formed on the surface of the n⁺ region 31 and the above-mentioned region, respectively.

The bottom of the source electrode 34 is in ohmic contact with the n⁺ region 31 [m-plane 3 (m1)]. In the present modification, since the source electrode 34 contacts the n⁺ region 31, good ohmic contact is established. The bottom of the drain electrode 35 is in ohmic contact with the m-plane 3 (m2) of the electron transit layer 3 and the m-plane 4 (m) of the electron supply layer 4.

Then, the gate electrode 36 is formed on the gate insulator 33. A resist mask used for forming the gate electrode 36 is formed. A resist is applied onto an entire surface of the product, and then an opening used for exposing the surface of the gate insulator 33, which is a region on which the gate electrode 36 is to be formed, is formed by a lithographic technique. In this manner, a resist mask having such an opening is formed.

An electrode material such as Ni/Au is deposited on the resist mask and in the opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 36 is formed above the n⁻ region 32 with the gate insulator 33 interposed therebetween.

In the present modification, the gate electrode 36 is formed above the n⁻ region 32 with the gate insulator 33 interposed therebetween. In the case where gate voltage is not applied to the gate electrode 36, a high resistance of the n⁻ region 32 enables a transistor to be in an off-mode. In contrast, in the case where gate voltage is applied, the energy band of the n⁻ region 32 is bent, and the n⁻ region 32 turns to an n⁺ region, which enables a transistor to be in an on-mode.

Figure 15B:
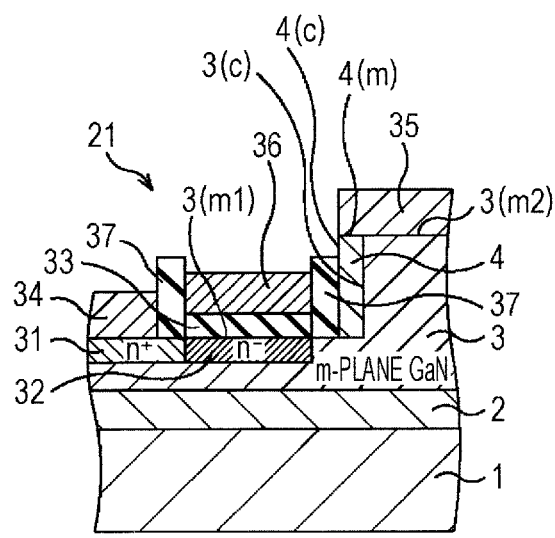

Then, as illustrated in FIG. 15B, an insulating film 37 is formed. In particular, an insulating material such as silicon oxide is deposited on an entire surface of the product by, for instance, a CVD method. The deposited silicon oxide is processed by a lithographic technique and dry etching. In this manner, the insulating film 37 is formed so as to have openings above the source electrode 34, the drain electrode 35, and the gate electrode 36 to expose these electrodes.

Then, manufacturing of the AlGaN/GaN-HEMT of the present modification is completed through processes for providing wiring connected to the source electrode 34, the drain electrode 35, and the gate electrode 36.

Figure 16A:
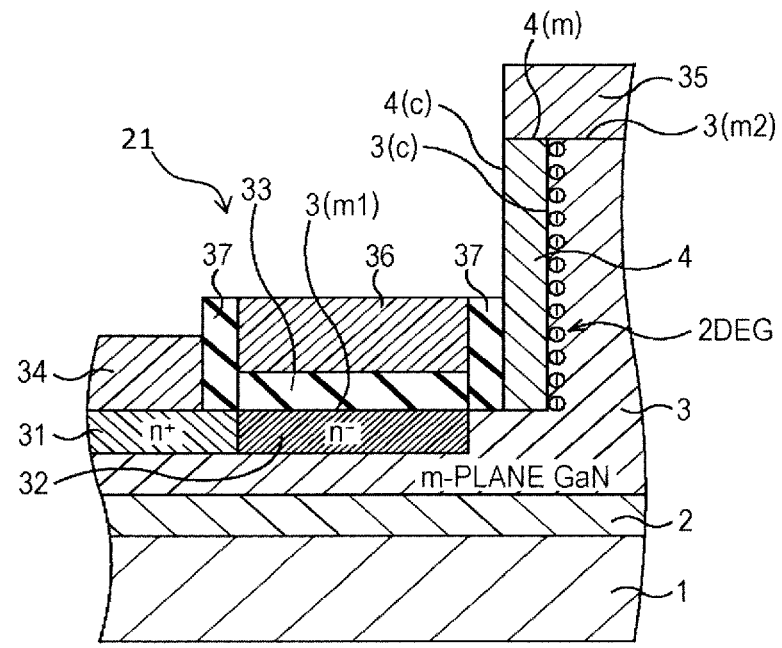
FIGS. 16A and 16B each schematically illustrate the AlGaN/GaN-HEMT according to the modification of the second embodiment.
Figure 16B:
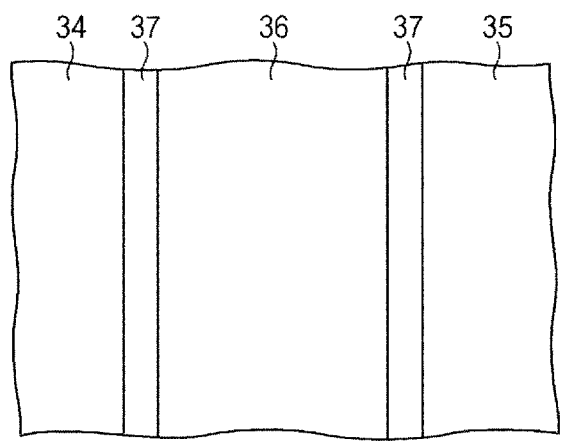

FIGS. 16A and 16B are a schematic cross-sectional view and a schematic plan view illustrating the AlGaN/GaN-HEMT of the present modification, respectively. The AlGaN/GaN-HEMT has a lateral structure between the gate electrode 36 and the source electrode 34 and a longitudinal structure between the gate electrode 36 and the drain electrode 35. The gate electrode 36 and the source electrode 34 are spaced apart from each other in a lateral direction (horizontal direction) along the bottom of the recess 21, and the gate electrode 36 and the drain electrode 35 are spaced apart from each other in a longitudinal direction (vertical direction) along the side surface of the recess 21.

In the AlGaN/GaN-HEMT of the present modification, a channel is formed between the source electrode 34 and the drain electrode 35. The gate electrode 36 is formed on the gate insulator 33 so as to overlie the n⁻ region 32. Part of the channel between the gate electrode 36 and the drain electrode 35, in other words, region along the interface of the electron transit layer 3 to the electron supply layer 4 is formed along the c-plane of the recess 21 being the non-polar face. High-concentration 2DEG is therefore generated in this part even in a state in which gate voltage is not applied. In contrast, 2DEG is not generated in part of the channel below the gate electrode 36 owing to the n⁻ region 32 in the case where gate voltage is not applied, and a transistor is thus in an off-mode. Operation in a normally-off mode is therefore steadily enabled.

In the AlGaN/GaN-HEMT of the present modification, part of the channel between the gate electrode 36 and the drain electrode 35 is formed along the c-plane of recess 21. On-resistance is therefore greatly reduced as compared with a case in which part of a channel between a gate electrode and a drain electrode is formed along an m-plane.

In the AlGaN/GaN-HEMT of the present modification, the source electrode 34 is formed on the n⁺ region 31 of the electron transit layer 3 such that contact is established therebetween. This structure enables stable ohmic contact to be established between the source electrode 34 and the electron transit layer 3.

In the AlGaN/GaN-HEMT of the present embodiment, part of the channel between the gate electrode 36 and the drain electrode 35 is formed in the lateral structure, in other words, along the side surface of the recess 21. Even if the length $L_{gd}$ between the gate electrode 36 and the drain electrode 35 in a vertical direction is increased to exhibit high withstand voltage, the length between the gate electrode 36 and the drain electrode 35 in a horizontal direction is equivalent to the thickness of the insulating film 37 at most and is therefore negligible. Thus, when the device is seen in plane view, an area occupied by the device is substantially greatly reduced, which enables integration of a large number of devices.

As in the second embodiment, on-resistance is approximately 15 to 30% smaller in the AlGaN/GaN-HEMT of the present modification than in existing AlGaN/GaN-HEMTs each having a lateral structure and the same channel length.

As described above, in the present modification, operation in a normally-off mode is enabled with a relatively simple configuration, on-resistance is decreased, and the horizontal distance between the gate electrode 36 and the drain electrode 35 is reduced as much as possible to enable sufficiently high integration. The AlGaN/GaN-HEMT provided in the present modification consequently has high reliability and withstand voltage.

Although the first and second embodiments and the modifications thereof have been described, embodiments are not limited thereto. In the first embodiment and the modification thereof, for instance, a gate insulator may be formed as in the modification of the second embodiment to provide an AlGaN/GaN-HEMT having an MIS structure. Moreover, in the second embodiment and the modification thereof, a GaN substrate having an upper surface that is an m-plane or a-plane may be used as in the modification of the first embodiment to provide an AlGaN/GaN-HEMT including no buffer layer and electron transit layer.

Third Embodiment

Figure 17:
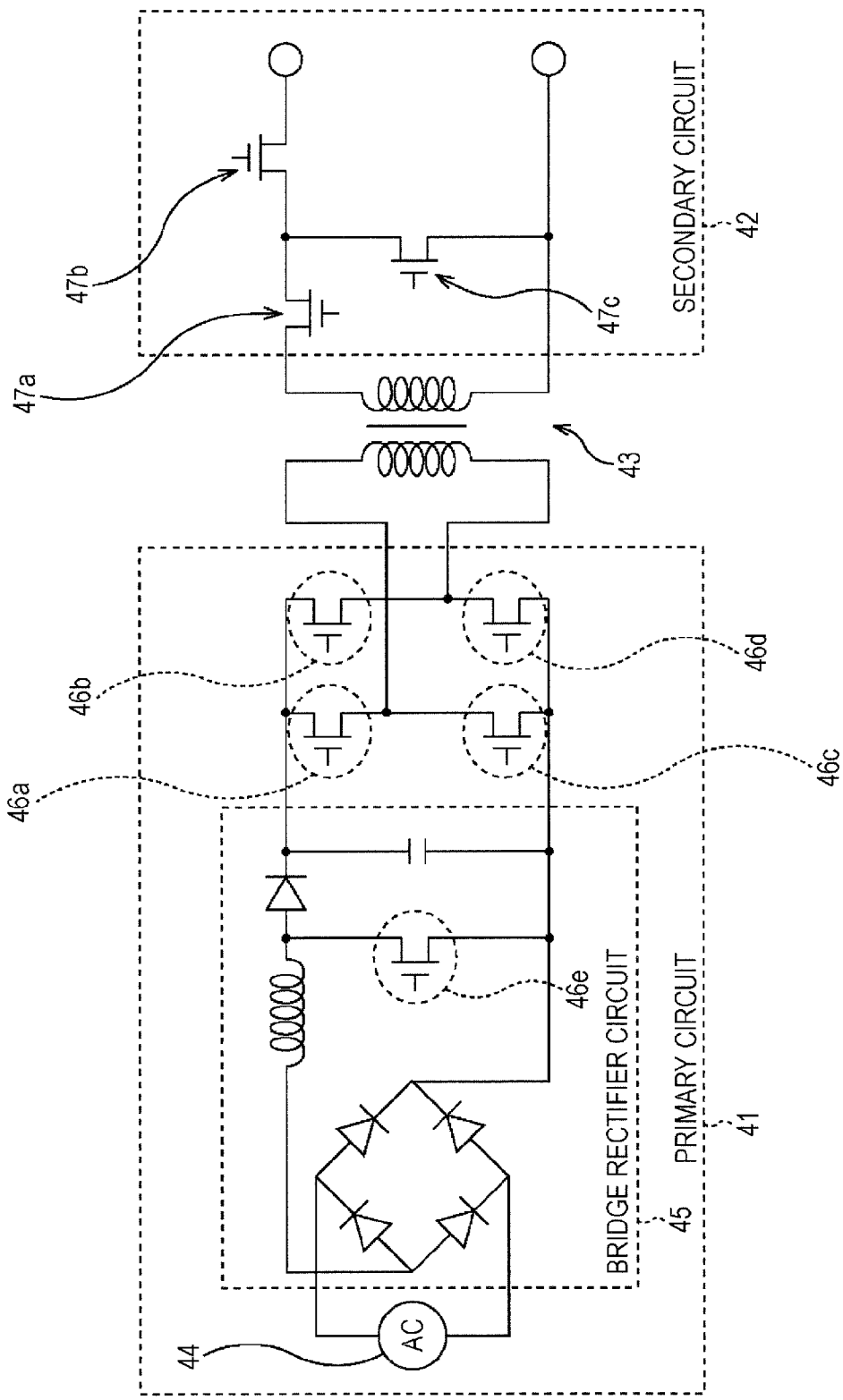
FIG. 17 is a schematic diagram illustrating the general configuration of power supply equipment according to a third embodiment.

A third embodiment discloses power supply equipment to which an AlGaN/GaN-HEMT selected from those of the first and second embodiments and modifications thereof is applied. FIG. 17 is a schematic diagram illustrating the general configuration of the power supply equipment according to the third embodiment.

The power supply equipment of the third embodiment includes a high-tension primary circuit 41, a low-tension secondary circuit 42, and a transformer 43 provided between the primary circuit 41 and the secondary circuit 42. The primary circuit 41 includes an alternating-current power supply 44, a bridge rectifier circuit 45, and multiple (four in the third embodiment) switching devices 46a, 46b, 46c, and 46d. The bridge rectifier circuit 45 includes a switching device 46e. The secondary circuit 42 includes multiple (three in the third embodiment) switching devices 47a, 47b, and 47c.

In the third embodiment, an AlGaN/GaN-HEMT selected from those of the first and second embodiments and modifications thereof is employed in each of the switching devices 46a, 46b, 46c, 46d, and 46e of the primary circuit 41. In contrast, an existing MIS field effect transistor (FET) using silicon is used in each of the switching devices 47a, 47b, and 47c of the secondary circuit 42.

In the third embodiment, the AlGaN/GaN-HEMT used in the high-tension circuit exhibits high withstand voltage and has the following effects: enabling operation in a normally-off mode with a relatively simple configuration, decreasing on-resistance, and reducing horizontal distance between the gate electrode and the drain electrode as much as possible to provide sufficiently high integration density. This configuration enables a power supply circuit having high reliability and exhibiting high power.

Fourth Embodiment

Figure 18:
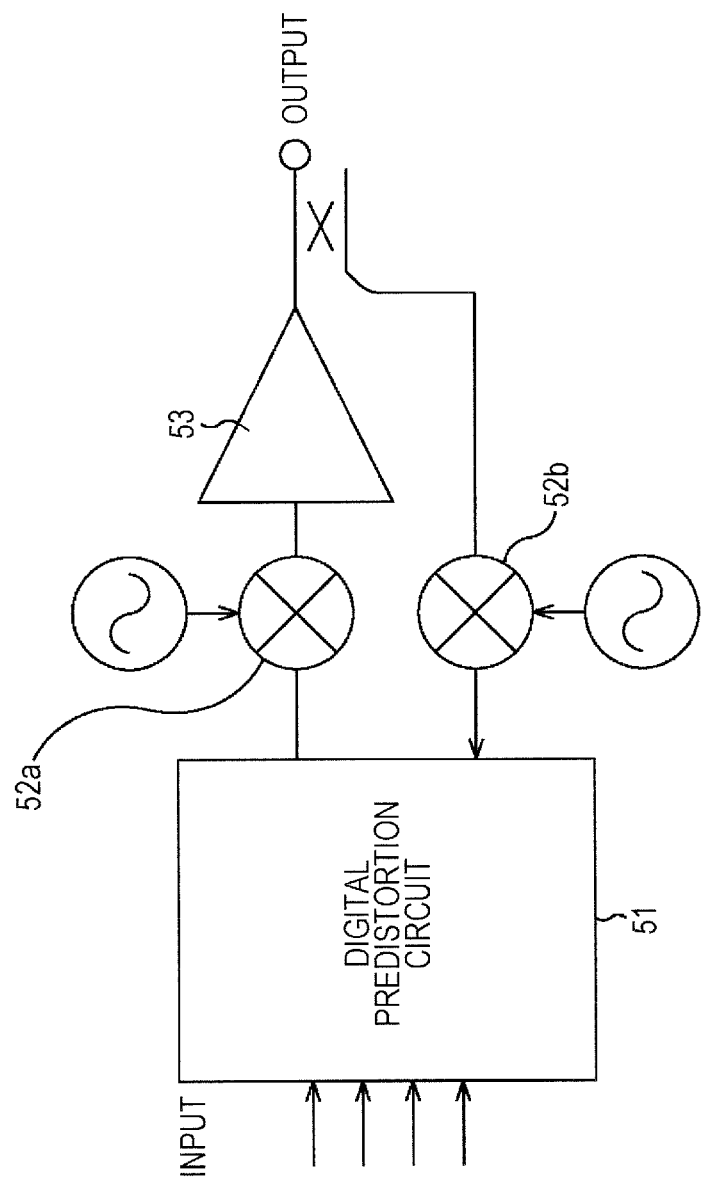
FIG. 18 is a schematic diagram illustrating the general configuration of a high-frequency amplifier according to a fourth embodiment.

A fourth embodiment discloses a high-frequency amplifier to which an AlGaN/GaN-HEMT selected from those of the first and second embodiments and modifications thereof is applied. FIG. 18 is a schematic diagram illustrating the general configuration of the high-frequency amplifier according to the fourth embodiment.

The high-frequency amplifier of the fourth embodiment includes a digital predistortion circuit 51, mixers 52a and 52b, and a power amplifier 53. The digital predistortion circuit 51 compensates for the nonlinear distortions of input signals. The mixer 52a mixes the input signals subjected to compensation for nonlinear distortions with alternating current signals. The power amplifier 53 amplifies the input signals mixed with the alternating current signals and includes an AlGaN/GaN-HEMT selected from those of the first and second embodiments and modifications thereof. In the configuration illustrated in FIG. 18, for example, switching operation allows the mixer 52b to mix output signals with alternating current signals and then transmit the mixed signals to the digital predistortion circuit 51.

In the fourth embodiment, the AlGaN/GaN-HEMT used in the high-frequency amplifier exhibits high withstand voltage and has the following effects: enabling operation in a normally-off mode with a relatively simple configuration, decreasing on-resistance, and reducing horizontal distance between the gate electrode and the drain electrode as much as possible to provide sufficiently high integration density. This configuration enables a high-frequency amplifier having high reliability and high withstand voltage.

Other Embodiments

In the first to fourth embodiments, AlGaN/GaN-HEMTs have been each described as a compound semiconductor device. The present disclosure may be applied to compound semiconductor devices other than such AlGaN/GaN-HEMTs: for example, the HEMTs described below.

First Example of Another HEMT

A first example discloses an InAlN/GaN-HEMT as a compound semiconductor device. InAlN and GaN are compound semiconductors which are enabled to have a close lattice constant on the basis of their compositions. In this case, the electron transit layer and electron supply layer in each of the first and second embodiments and modifications thereof are formed from i-GaN or n-GaN and i-InAlN or n-InAlN, respectively. In addition, since piezoelectric polarization is not substantially generated in this case, 2DEG is mainly generated by spontaneous polarization of InAlN.

In the first example, as in the above-mentioned AlGaN/GaN-HEMTs, operation in a normally-off mode is enabled with a relatively simple configuration, on-resistance is decreased, and the horizontal distance between the gate electrode and the drain electrode is reduced as much as possible to provide sufficiently high integration density. The InAlN/GaN-HEMT provided in the first example consequently has high reliability and withstand voltage.

Second Example of Another HEMT

A second example discloses an InAlGaN/GaN-HEMT as a compound semiconductor device. The composition of InAlGaN may be changed to adjust its lattice constant to be smaller than that of GaN. In this case, the electron transit layer and the electron supply layer in each of the first and second embodiments and modifications thereof are formed from i-GaN or n-GaN and i-InAlGaN or n-InAlGaN, respectively.

In the second example, as in the above-mentioned AlGaN/GaN-HEMTs, operation in a normally-off mode is enabled with a relatively simple configuration, on-resistance is decreased, and the horizontal distance between the gate electrode and the drain electrode is reduced as much as possible to provide sufficiently high integration density. The InAlGaN/GaN-HEMT provided in the second example consequently has high reliability and withstand voltage.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device, comprising:
    a compound semiconductor region having a surface in which a step is formed;
    a first electrode formed on an upper surface of the step, the upper surface being a non-polar face;
    a second electrode formed along one side surface of the step so as to be spaced apart from the first electrode in a vertical direction, the one side surface being a polar face, and
    a third electrode formed along another side surface of the step so as to be spaced apart from the first electrode in a horizontal direction, the another side surface being a polar face,
    wherein a vertical distance between a lower surface of the first electrode and an upper surface of the second electrode is longer than a vertical distance between the lower surface of the first electrode and a lower surface of the third electrode,
    wherein a first n-doped region is formed so as to underlie the third electrode in the step, and
    wherein a second n-doped region is formed in the step between the first electrode and the third electrode, and a dopant concentration is lower in the second n-doped region than in the first n-doped region.

2. The compound semiconductor device according to claim 1,
    wherein the step is in the form of a protrusion.

3. A method for manufacturing a compound semiconductor device, the method comprising:
    forming a step in a surface of a compound semiconductor region;
    forming a first electrode on an upper surface of the step, the upper surface being a non-polar face;
    forming a second electrode along one side surface of the step, the second electrode being spaced apart from the first electrode in a vertical direction, the one side surface being a polar face, and
    forming a third electrode along another side surface of the step, the third electrode being spaced apart from the first electrode in a horizontal direction, the another side surface being a polar face,
    wherein a vertical distance between a lower surface of the first electrode and an upper surface of the second electrode is longer than a vertical distance between the lower surface of the first electrode and a lower surface of the third electrode,
    wherein a first n-doped region is formed in the step so as to underlie the third electrode, and
    wherein a second n-doped region is formed in the step between the first electrode and the third electrode, and a dopant concentration is lower in the second n-doped region than in the first n-doped region.

4. The method for manufacturing a compound semiconductor device according to claim 3,
    wherein the step is in the form of a protrusion.

5. A compound semiconductor device, comprising:
    a compound semiconductor region having a surface in which a step is formed;
    a first electrode formed on an upper surface of the step, the upper surface being a non-polar face;
    a second electrode formed along one side surface of the step so as to be spaced apart from the first electrode in a vertical direction, the one side surface being a polar face, and
    a third electrode formed along another side surface of the step so as to be spaced apart from the first electrode in a horizontal direction, the another side surface being a polar face,
    wherein a first n-doped region is formed so as to underlie the third electrode in the step, and
    wherein a second n-doped region is formed in the step between the first electrode and the third electrode, and a dopant concentration is lower in the second n-doped region than in the first n-doped region.

6. A method for manufacturing a compound semiconductor device, the method comprising:
    forming a step in a surface of a compound semiconductor region;
    forming a first electrode on an upper surface of the step, the upper surface being a non-polar face;
    forming a second electrode along one side surface of the step, the second electrode being spaced apart from the first electrode in a vertical direction, the one side surface being a polar face, and
    forming a third electrode along another side surface of the step, the third electrode being spaced apart from the first electrode in a horizontal direction, the another side surface being a polar face,
    wherein a first n-doped region is formed in the step so as to underlie the third electrode, and
    wherein a second n-doped region is formed in the step between the first electrode and the third electrode, and a dopant concentration is lower in the second n-doped region than in the first n-doped region.

* * * * *